(12) United States Patent
Kunisato et al.

(10) Patent No.: US 7,488,613 B2
(45) Date of Patent: Feb. 10, 2009

(54) NITRIDE-BASED LIGHT-EMITTING DEVICE AND METHOD OF MANUFACTURING THE SAME

(75) Inventors: Tatsuya Kunisato, Takatsuki (JP); Ryoji Hiroyama, Kyo-tanabe (JP); Masayuki Hata, Kadoma (JP); Kiyoshi Oota, Neyagawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/907,649

(22) Filed: Oct. 16, 2007

(65) Prior Publication Data

US 2008/0064130 A1 Mar. 13, 2008

Related U.S. Application Data

(62) Division of application No. 11/047,580, filed on Feb. 2, 2005.

(30) Foreign Application Priority Data

Feb. 6, 2004 (JP) ............... 2004-030048

(51) Int. Cl.
  *H01L 21/00* (2006.01)
  *H01L 33/00* (2006.01)
(52) U.S. Cl. .............. 438/47; 438/22; 438/46; 438/48; 257/79; 257/94; 257/99; 257/E21.292; 257/E21.294
(58) Field of Classification Search ............ 438/47, 438/48; 257/79, 94
See application file for complete search history.

(56) References Cited

U.S. PATENT DOCUMENTS

| | | | |
|---|---|---|---|
| 6,492,661 B1 | 12/2002 | Chien et al. | |
| 6,509,651 B1 | 1/2003 | Matsubara et al. | |
| 6,562,648 B1 | 5/2003 | Wong et al. | |
| 6,825,502 B2 | 11/2004 | Okazaki et al. | |
| 6,841,808 B2 | 1/2005 | Shibata et al. | |
| 6,909,185 B1 | 6/2005 | Kondo et al. | |
| 7,301,175 B2 | 11/2007 | Izuno et al. | |
| 7,390,684 B2 | 6/2008 | Izuno et al. | |

(Continued)

FOREIGN PATENT DOCUMENTS

CN 1330416 A 1/2002

(Continued)

OTHER PUBLICATIONS

Chinese Office Action, with English translation, issued in Chinese Patent Application No. CN 200510007356.9, mailed on Oct. 12, 2007.

(Continued)

*Primary Examiner*—Dao H Nguyen
(74) *Attorney, Agent, or Firm*—McDermott Will & Emery LLP

(57) ABSTRACT

A nitride-based light-emitting device capable of suppressing reduction of the light output characteristic as well as reduction of the manufacturing yield is provided. This nitride-based light-emitting device comprises a conductive substrate at least containing a single type of metal and a single type of inorganic material having a lower linear expansion coefficient than the metal and a nitride-based semiconductor element layer bonded to the conductive substrate.

4 Claims, 18 Drawing Sheets

U.S. PATENT DOCUMENTS

| | | |
|---|---|---|
| 2003/0062530 A1 | 4/2003 | Okazaki et al. |
| 2004/0072383 A1* | 4/2004 | Nagahama et al. ............ 438/47 |

FOREIGN PATENT DOCUMENTS

| | | |
|---|---|---|
| CN | 1093565 C | 10/2002 |
| CN | 1423346 A | 6/2003 |
| EP | 1 167 559 A1 | 1/2002 |
| JP | 09-008403 | 1/1997 |
| JP | 9-8403 | 1/1997 |
| JP | 10-154780 | 6/1998 |
| JP | 11-68157 | 3/1999 |
| JP | 2000-311971 | 11/2000 |
| JP | 2003-309289 | 10/2003 |
| WO | WO 03/034508 A1 | 4/2003 |

OTHER PUBLICATIONS

European Search Report issued in European Patent Application No. EP 05 25 0451, mailed Dec. 18, 2007.

Chinese Office Action, with English translation, issued in Chinese Patent Application No. 200510007356.9, dated Jun. 6, 2008.

http://www.owlnet.rice.edu/~msci301/ThermalExpansion.pdf, 2002.

http://www.mwee.com/magazine/2000/oct2000-art2.html, 2000.

http://www.sintecoptronics.com/znse.htm, date not provided on website.

Japanese Office Action, with English translation, issued in Japanese Office Action, 2004-030048 dated on Sep. 30, 2008.

* cited by examiner

LASER IRRADIATION

NITRIDE-BASED LIGHT-EMITTING DEVICE AND METHOD OF MANUFACTURING THE SAME

RELATED APPLICATIONS

This application is a Divisional of U.S. Application Ser. No. 11/047,580, filed Feb. 2, 2005, claiming priority of Japanese Application No. 2004-030048, filed Feb. 6, 2004, the entire contents of each of which are hereby incorporated by reference.

BACKGROUND OF THE INVENTION

1. Field of the Invention

The present invention relates to a nitride-based light-emitting device and a method of manufacturing the same, and more particularly, it relates to a nitride-based light-emitting device comprising a nitride-based semiconductor element layer and a method of manufacturing the same.

2. Description of the Background Art

A nitride-based light-emitting device such as a nitride-based light-emitting diode device comprising a nitride-based semiconductor element layer consisting of a nitride-based semiconductor is actively developed at present. In order to employ a nitride-based light-emitting diode device as the light source for a lighting fixture, improvement of the light output characteristic of the nitride-based light-emitting diode device and increase of an applied current have recently been developed in particular. In order to form such a nitride-based light-emitting diode device, a nitride-based semiconductor element layer is grown on a sapphire substrate requiring a more reasonable cost than a high-priced nitride-based semiconductor substrate of GaN or the like.

FIG. 35 is a sectional view showing the structure of a conventional nitride-based light-emitting diode device. Referring to FIG. 35, a buffer layer 102, an underlayer 103, an n-type contact layer 104, an n-type cladding layer 105 and an active layer 106 are successively formed on an insulating sapphire substrate 101 in the conventional nitride-based light-emitting diode device. A cap layer 107, a p-type cladding layer 108 and a p-type contact layer 109 are successively formed on the active layer 106. The n-type contact layer 104, the n-type cladding layer 105, the active layer 106, the cap layer 107, the p-type cladding layer 108 and the p-type contact layer 109 constitute a nitride-based semiconductor element layer 100.

A prescribed region of the nitride-based semiconductor element layer 100 is removed between the upper surface of the p-type contact layer 109 and a portion of an intermediate depth of the n-type contact layer 104, for partially exposing the n-type contact layer 104. A p-side electrode 110 is formed on the p-type contact layer 109, while an n-side electrode 111 is formed on a prescribed region of the exposed surface of the n-type contact layer 104.

In the conventional nitride-based light-emitting diode device shown in FIG. 35, as hereinabove described, the p-side electrode 110 and the n-side electrode 11 are taken out from the surface of the nitride-based semiconductor element layer 100 opposite to the sapphire substrate 101. In order to increase the emission area for improving the light output characteristic, therefore, light must be emitted from the side of the sapphire substrate 101 formed with neither the p-side electrode 110 nor the n-side electrode 111. Therefore, flip chip bonding is employed for mounting the conventional nitride-based light-emitting diode device shown in FIG. 35 to a base (not shown) from the side of the p-side electrode 110 and the n-side electrode 111.

However, the conventional nitride-based light-emitting diode device shown in FIG. 35 has a step between the p-side electrode 110 formed on the p-type contact layer 109 and the n-side electrode 111 formed on the exposed surface of the n-type contact layer 104. In order to assemble the conventional nitride-based light-emitting diode device shown in FIG. 35 by flip chip bonding, therefore, it is necessary to provide the base with a step portion corresponding to the step between the p-side electrode 110 and the n-side electrode 111 with precise position control for attaining coincidence between the positions of the step portion and the p-side electrode 110 and the n-side electrode 111. Therefore, the manufacturing yield is disadvantageously reduced. Further, the thermal conductivity of the sapphire substrate 101 of the conventional nitride-based light-emitting diode device shown in FIG. 35 is so low that it is disadvantageously difficult to sufficiently radiate heat generated in the nitride-based semiconductor element layer 100.

Therefore, generally proposed is a nitride-based light-emitting diode device formed by growing a nitride-based semiconductor element layer on a sapphire substrate and thereafter bonding a cleavable conductive substrate of GaAs or the like to the nitride-based semiconductor element layer and removing the sapphire substrate, as disclosed in Japanese Patent Laying-Open No. 9-8403 (1997), for example. In the aforementioned nitride-based light-emitting diode device disclosed in Japanese Patent Laying-Open No. 9-8403, a p-side electrode and an n-side electrode can be oppositely arranged through the nitride-based semiconductor element layer due to the employment of the conductive substrate. Therefore, the nitride-based light-emitting diode device may not be assembled by flip chip bonding requiring precise position control dissimilarly to the case of employing the insulating sapphire substrate, whereby the manufacturing yield can be improved.

In the aforementioned nitride-based light-emitting diode device disclosed in Japanese Patent Laying-Open No. 9-8403, however, the thermal conductivity of the conductive substrate of GaAs or the like is so insufficient that it is disadvantageously difficult to sufficiently radiate heat generated in the nitride-based semiconductor element layer, similarly to the case of employing the sapphire substrate. Consequently, the light output characteristic is disadvantageously reduced by heat when a high current is fed to the nitride-based light-emitting diode device. Further, difference between the linear expansion coefficients of the conductive substrate of GaAs or the like and the nitride-based semiconductor element layer of GaN or the like is so large that the nitride-based light-emitting diode device is warped in the manufacturing process due to the difference between the linear expansion coefficients. Consequently, the manufacturing yield is disadvantageously reduced due to the warping of the diode device.

SUMMARY OF THE INVENTION

The present invention has been proposed in order to solve the aforementioned problems, and an object of the present invention is to provide a nitride-based light-emitting device capable of suppressing reduction of the light output characteristic as well as reduction of the manufacturing yield.

Another object of the present invention is to provide a method of manufacturing a nitride-based light-emitting device capable of suppressing reduction of the light output characteristic as well as reduction of the manufacturing yield.

In order to attain the aforementioned objects, a nitride-based light-emitting device according to a first aspect of the present invention comprises a conductive substrate at least containing a single type of metal and a single type of inorganic material having a lower linear expansion coefficient than the metal and a nitride-based semiconductor element layer bonded to the conductive substrate.

In the nitride-based light-emitting device according to the first aspect, as hereinabove described, the conductive substrate is so constituted as to contain at least a single type of metal and a single type of inorganic material having a lower linear expansion coefficient than the metal, whereby the conductive substrate can be provided with high thermal conductivity similar to that of the metal. When a high current is fed to the nitride-based light-emitting device, therefore, heat generated in the nitride-based semiconductor element layer can be sufficiently radiated toward the conductive substrate, whereby reduction of the light output characteristic caused by heat can be suppressed. Consequently, the nitride-based light-emitting device can be provided with a high rated output. Further, the linear expansion coefficient of the conductive substrate can be approached to that of the nitride-based semiconductor element layer by adjusting the mixing ratio between the metal and the inorganic material through the function of the inorganic material having a low linear expansion coefficient contained in the conductive substrate, whereby the difference between the linear expansion coefficients of the conductive substrate and the nitride-based semiconductor element layer can be reduced. Thus, the nitride-based light-emitting device can be inhibited from warping or cracking resulting from large difference between the linear expansion coefficients of the conductive substrate and the nitride-based semiconductor layer in the manufacturing process, whereby reduction of the manufacturing yield can be suppressed. Further, the conductive substrate is so employed that two electrodes can be oppositely arranged through the nitride-based semiconductor element layer. Thus, the emission area can be increased as compared with a nitride-based light-emitting device employing an insulating substrate having two electrodes arranged only on one side of a nitride-based semiconductor element layer, whereby the light output characteristic can be improved. In addition, the nitride-based light-emitting device may not be assembled by flip chip bonding requiring precise position control for improving the light output characteristic, whereby reduction of the manufacturing yield can be suppressed also by this.

In the aforementioned nitride-based light-emitting device according to the first aspect, the inorganic material preferably includes a metal oxide. According to this structure, the linear expansion coefficient of the conductive substrate containing the metal and the inorganic material (metal oxide) can be easily rendered lower than that of a conductive substrate consisting of only a metal.

In the aforementioned nitride-based light-emitting device according to the first aspect, the conductive substrate and the nitride-based semiconductor element layer are preferably bonded to each other through at least either an electrode or a conductive material. According to this structure, the conductive substrate can be easily bonded to the nitride-based semiconductor element layer.

In this case, the conductive substrate and the nitride-based semiconductor element layer are preferably bonded to each other through the electrode. According to this structure, the conductive substrate and the nitride-based semiconductor element layer can be easily bonded to each other through the electrode.

In the aforementioned structure having the conductive substrate and the nitride-based semiconductor element layer bonded to each other through the electrode, a surface of the electrode closer to the nitride-based semiconductor element layer is preferably textured, and the nitride-based semiconductor element layer is preferably formed on the textured surface of the electrode. According to this structure, light incident upon the interface between the electrode and the nitride-based semiconductor element layer is easily reflected due to the textured surface of the electrode. Thus, the reflected light is emitted from a surface (light-emitting surface) of the nitride-based semiconductor element layer opposite to the conductive substrate, whereby the light output characteristic can be improved.

In the aforementioned structure having the conductive substrate and the nitride-based semiconductor element layer bonded to each other through the electrode, a surface of the conductive substrate closer to the electrode is preferably textured, and the electrode is preferably bonded to the textured surface of the conductive substrate. According to this structure, the contact area between the conductive substrate and the electrode is so increased that heat radiation toward the conductive substrate can be further improved.

The aforementioned nitride-based light-emitting device according to the first aspect preferably further comprises a protective film covering the side surface of the nitride-based semiconductor element layer. According to this structure, the protective film can protect the nitride-based semiconductor element layer.

In the aforementioned nitride-based light-emitting device according to the first aspect, the metal preferably includes copper. According to this structure, the conductive substrate can be easily provided with high thermal conductivity similar to that of copper through the function of copper.

In the aforementioned nitride-based light-emitting device according to the first aspect, the inorganic material preferably includes copper oxide. According to this structure, the linear expansion coefficient of the conductive substrate can be easily approached to that of the nitride-based semiconductor element layer through the function of copper oxide, whereby the difference between the linear expansion coefficients of the conductive substrate and the nitride-based semiconductor element layer can be reduced.

In the aforementioned nitride-based light-emitting device according to the first aspect, the metal preferably includes copper, and the inorganic material preferably includes copper oxide. The conductive substrate containing such materials has a linear expansion coefficient close to that of a nitride-based semiconductor such as GaN used for a light-emitting device and high thermal conductivity, whereby warping of the nitride-based light-emitting device resulting from large difference between the linear expansion coefficients of the conductive substrate and the nitride-based semiconductor element layer can be easily suppressed while sufficiently radiating heat generated in the nitride-based semiconductor element layer toward the conductive substrate.

In the aforementioned nitride-based light-emitting device according to the first aspect, the conductive substrate preferably has thermal conductivity of at least about 100 W/m·K. According to this structure, heat generated in the nitride-based semiconductor element layer can be easily sufficiently radiated toward the conductive substrate. This point has already been experimentally confirmed.

In the aforementioned nitride-based light-emitting device according to the first aspect, the conductive substrate preferably has a Young's modulus of not more than about 120 GPa. According to this structure, the conductive substrate can be inhibited from deformation under stress. Thus, the nitride-based semiconductor element layer bonded to the conductive substrate can be inhibited from deformation under stress resulting from deformation under stress of the conductive substrate when the same is separated from a growth substrate. Therefore, the nitride-based semiconductor element layer can be inhibited from cracking, whereby reduction of the manufacturing yield resulting from cracking of the nitride-based light-emitting device can be suppressed. This point has also been already experimentally confirmed.

In the aforementioned nitride-based light-emitting device according to the first aspect, the conductive substrate preferably has a linear expansion coefficient of not more than about $18 \times 10^{-6}$/K. According to this structure, the difference between the linear expansion coefficients of the conductive substrate and the nitride-based semiconductor element layer can be easily reduced. Thus, the nitride-based light-emitting device can be inhibited from warping resulting from large difference between the linear expansion coefficients of the conductive substrate and the nitride-based semiconductor element layer. This point has also been already experimentally confirmed.

A method of manufacturing a nitride-based light-emitting device according to a second aspect of the present invention comprises steps of growing a nitride-based semiconductor element layer on a growth substrate, bonding a conductive substrate at least containing a single type of metal and a single type of inorganic material having a lower linear expansion coefficient than the metal to the nitride-based semiconductor element layer and removing the growth substrate from the nitride-based semiconductor element layer to which the conductive substrate is bonded.

In the method of manufacturing a nitride-based light-emitting device according to the second aspect, as hereinabove described, the conductive substrate at least containing a single type of metal and a single type of inorganic material having a lower linear expansion coefficient than the metal is bonded to the nitride-based semiconductor element layer provided on the growth substrate and the growth substrate is thereafter removed from the nitride-based semiconductor element layer, whereby the conductive substrate can be provided with high thermal conductivity similar to that of the metal through the function of the metal contained in the conductive substrate. When a high current is fed to the nitride-based light-emitting device, therefore, heat generated in the nitride-based semiconductor element layer can be sufficiently radiated toward the conductive substrate, whereby reduction of the light output characteristic caused by heat can be suppressed. Consequently, it is possible to form a nitride-based light-emitting device having a high rated output. Further, the linear expansion coefficient of the conductive substrate can be approached to that of the nitride-based semiconductor element layer by adjusting the mixing ratio between the metal and the inorganic material through the function of the inorganic material having a low linear expansion coefficient contained in the conductive substrate, whereby the distance between the linear expansion coefficients of the conductive substrate and the nitride-based semiconductor element layer can be reduced. Thus, the nitride-based light-emitting device can be inhibited from warping or cracking resulting from large difference between the linear expansion coefficients of the conductive substrate and the nitride-based semiconductor element layer in the manufacturing process, whereby reduction of the manufacturing yield can be suppressed. Further, the conductive substrate is so employed that two electrodes can be oppositely arranged through the nitride-based semiconductor element layer. Thus, the emission area can be increased as compared with a nitride-based light-emitting device employing an insulating substrate having two electrodes arranged only on one side of a nitride-based semiconductor element layer, whereby a nitride-based light-emitting device capable of improving the light output characteristic can be formed. In addition, the nitride-based light-emitting device may not be assembled by flip chip bonding requiring precise position control for improving the light output characteristic, whereby reduction of the manufacturing yield can be suppressed also by this.

In the aforementioned method of manufacturing a nitride-based light-emitting device according to the second aspect, the inorganic material preferably includes a metal oxide. According to this structure, the linear expansion coefficient of the conductive substrate containing the metal and the inorganic material (metal oxide) can be easily rendered lower than that of a conductive substrate consisting of only a metal.

In the aforementioned method of manufacturing a nitride-based light-emitting device according to the second aspect, the step of bonding the conductive substrate to the nitride-based semiconductor element layer preferably includes a step of bonding the conductive substrate to the nitride-based semiconductor element layer through at least either an electrode or a conductive material. According to this structure, the conductive substrate can be easily bonded to the nitride-based semiconductor element layer.

In this case, the step of bonding the conductive substrate to the nitride-based semiconductor element layer preferably includes a step of bonding the conductive substrate to the nitride-based semiconductor element layer through the electrode. According to this structure, the conductive substrate and the nitride-based semiconductor element layer can be easily bonded to each other through the electrode.

In the aforementioned structure including the step of bonding the conductive substrate to the nitride-based semiconductor element layer through the electrode, the step of bonding the conductive substrate to the nitride-based semiconductor element layer through the electrode preferably includes steps of texturing a surface of the nitride-based semiconductor element layer, forming the electrode on the textured surface of the nitride-based semiconductor element layer and bonding the conductive substrate to a surface of the electrode opposite to the nitride-based semiconductor element layer. According to this structure, light incident upon the interface between the electrode and the nitride-based semiconductor element layer is easily reflected due to the textured surface of the electrode. Thus, the reflected light is emitted from a surface (light-emitting surface) of the nitride-based semiconductor element layer opposite to the conductive substrate, whereby the light output characteristic can be improved.

In the aforementioned structure including the step of bonding the conductive substrate to the nitride-based semiconductor element layer through the electrode, the step of forming the electrode on the textured surface of the nitride-based semiconductor element layer preferably includes a step of forming the electrode on the textured surface of the nitride-based semiconductor element layer to have a textured surface reflecting the texture on the surface of the nitride-based semiconductor element, and the step of bonding the conductive substrate to the surface of the electrode opposite to the nitride-based semiconductor element layer preferably includes steps of texturing a surface of the conductive substrate and bonding the conductive substrate to the surface of the electrode opposite to the nitride-based semiconductor element layer so that the positions of projecting and recess portions of the electrode and the positions of recess and projecting portions of the conductive substrate coincide with each other. According to this structure, the contact area between the conductive substrate and the electrode is so increased that heat radiation toward the conductive substrate can be further improved.

The aforementioned method of manufacturing a nitride-based light-emitting device according to the second aspect preferably further comprises a step of forming a protective film to cover the side surface of the nitride-based semiconductor element layer in advance of the step of bonding the conductive substrate to the nitride-based semiconductor element layer. According to this structure, the protective film can protect the nitride-based semiconductor element layer.

In the aforementioned method of manufacturing a nitride-based light-emitting device according to the second aspect, the metal may include copper. According to this structure, the conductive substrate can be easily provided with high thermal conductivity similar to that of copper through the function of copper.

In the aforementioned method of manufacturing a nitride-based light-emitting device according to the second aspect, the inorganic material may include copper oxide. According to this structure, the linear expansion coefficient of the conductive substrate can be easily approached to that of the nitride-based semiconductor element layer through the function of copper oxide, whereby the difference between the linear expansion coefficients of the conductive substrate and the nitride-based semiconductor element layer can be reduced.

In the aforementioned method of manufacturing a nitride-based light-emitting device according to the second aspect, the metal may include copper, and the inorganic material may include copper oxide. The conductive substrate containing such materials has a linear expansion coefficient close to that of a nitride-based semiconductor such as GaN used for a light-emitting device and high thermal conductivity, whereby warping of the nitride-based light-emitting device resulting from large difference between the linear expansion coefficients of the conductive substrate and the nitride-based semiconductor element layer can be easily suppressed while sufficiently radiating heat generated in the nitride-based semiconductor element layer toward the conductive substrate.

In the aforementioned method of manufacturing a nitride-based light-emitting device according to the second aspect, the conductive substrate may have thermal conductivity of at least about 100 W/m·K. According to this structure, heat generated in the nitride-based semiconductor element layer can be easily sufficiently radiated toward the conductive substrate. This point has already been experimentally confirmed.

In the aforementioned method of manufacturing a nitride-based light-emitting device according to the second aspect, the conductive substrate may have a Young's modulus of not more than about 120 GPa. According to this structure, the conductive substrate can be inhibited from deformation under stress. Thus, the nitride-based semiconductor element layer bonded to the conductive substrate can be inhibited from deformation under stress resulting from deformation under stress of the conductive substrate when the same is separated from the growth substrate. Therefore, the nitride-based semiconductor element layer can be inhibited from cracking, whereby reduction of the manufacturing yield resulting from cracking of the nitride-based light-emitting device can be suppressed. This point has also been already experimentally confirmed.

In the aforementioned method of manufacturing a nitride-based light-emitting device according to the second aspect, the conductive substrate may have a linear expansion coefficient of not more than about $18 \times 10^{-6}$/K. According to this structure, the difference between the linear expansion coefficients of the conductive substrate and the nitride-based semiconductor element layer can be easily reduced. Thus, the nitride-based light-emitting device can be inhibited from cracking resulting from large difference between the linear expansion coefficients of the conductive substrate and the nitride-based semiconductor element layer. This point has also been already experimentally confirmed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a nitride-based light-emitting diode device according to a first embodiment of the present invention is described with reference to FIG. 1.

Figure 1:
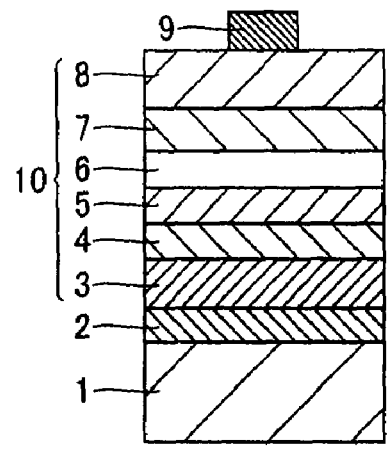
FIG. 1 is a sectional view showing the structure of a nitride-based light-emitting diode device according to a first embodiment of the present invention.

In the nitride-based light-emitting diode device according to the first embodiment, a nitride-based semiconductor element layer 10 is formed on a conductive substrate 1 through a p-side electrode 2, as shown in FIG. 1. According to the first embodiment, the conductive substrate 1 has a thickness of about 50 μm to about 2 mm, and contains copper and copper oxide mixed with each other at a ratio of 20:80.

More specifically, the p-side electrode 2 prepared by successively forming an Au layer having a thickness of about 100 nm and a Pd layer having a thickness of about 300 nm from the side closer to the conductive substrate 1 is bonded to the conductive substrate 1. The p-side electrode 2 is an example of the "electrode" in the present invention. A p-type contact layer 3 of GaN, AlGaN or InGaN doped with Mg, having a thickness of about 1 nm to about 1 μm, is formed on the p-side electrode 2. A p-type cladding layer 4 of AlGaN (Al composition ratio≦50%) doped with Mg, having a thickness of about 1 nm to about 1 μm, is formed on the p-type contact layer 3. A cap layer 5 of Mg-doped or undoped GaN or AlGaN having a thickness of about 10 nm to about 40 nm is formed on the p-type cladding layer 4. An active layer 6 including a well layer of InGaN having a thickness of about 3 nm and a barrier layer of InGaN or GaN having a thickness of about 10 nm is formed on the cap layer 5. This active layer 6 has a multiple quantum well (MQW) structure including a plurality of well layers and a plurality of barrier layers or a single quantum well (SQW) structure including a single well layer and a single barrier layer.

An n-type cladding layer 7 of AlGaN (Al composition ratio≦50%) doped with Si or Ge, having a thickness of about 1 nm to about 1 μm, is formed on the active layer 6. An n-type contact layer 8 of GaN or AlGaN doped with Si or Ge, having a thickness of about 10 nm to about 5 μm, is formed on the n-type cladding layer 7. The p-type contact layer 3, the p-type cladding layer 4, the cap layer 5, the active layer 6, the n-type cladding layer 7 and the n-type contact layer 8 constitute a nitride-based semiconductor element layer 10. An n-side electrode 9 is formed on a prescribed region of the n-type contact layer 8 constituting the nitride-based semiconductor element layer 10. This n-side electrode 9 is constituted of an Al layer having a thickness of about 10 nm, a Pd layer having a thickness of about 10 nm and an Au layer having a thickness of about 100 nm in ascending order.

A manufacturing process for the nitride-based light-emitting diode device according to the first embodiment is now described with reference to FIGS. 1 to 7.

Figure 2:
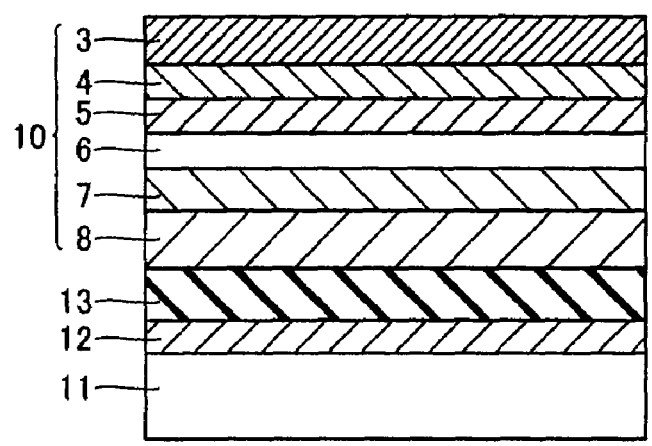
FIGS. 2 to 7 are sectional views for illustrating a manufacturing process for the nitride-based light-emitting diode device according to the first embodiment shown in FIG. 1.

As shown in FIG. 2, a buffer layer 12 of GaN or AlGaN having a thickness of about 10 nm to about 100 nm is grown on the (0001) plane of a sapphire substrate 11 having a thickness of about 400 μm for serving as a growth substrate by MOCVD (metal organic chemical vapor deposition). Then, an underlayer 13 of undoped GaN or AlGaN having a thickness of about 1 μm is grown on the buffer layer 12. Then, the nitride-based semiconductor element layer 10 consisting of the layers 3 to 8 having the aforementioned compositions and thicknesses is grown on the underlayer 13. At this time, the n-type contact layer 8, the n-type cladding layer 7, the active layer 6, the cap layer 5, the p-type cladding layer 4 and the p-type contact layer 3 are grown in this order for forming the nitride-based semiconductor element layer 10. Thereafter heat treatment or electron beam irradiation is so performed as to convert the p-type cladding layer 4 and the p-type contact layer 3 to the p type.

Figure 3:
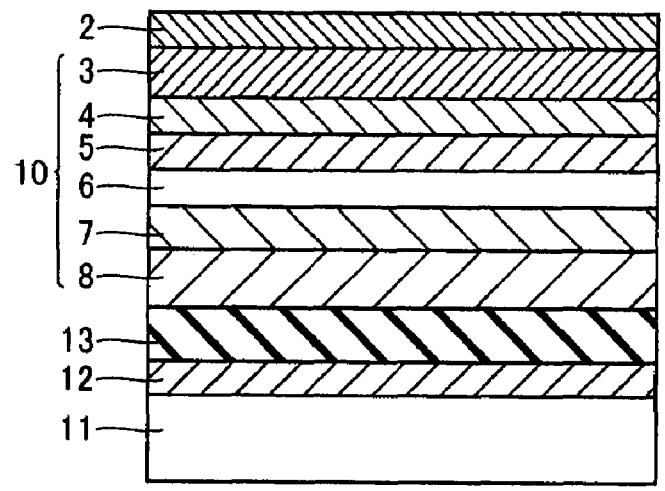

As shown in FIG. 3, the p-side electrode 2 is formed on the p-type contact layer 3 by vacuum evaporation or the like. In order to form the p-side electrode 2, the Pd layer having the thickness of about 300 nm and the Au layer having the thickness of about 100 nm are formed in this order.

Figure 4:
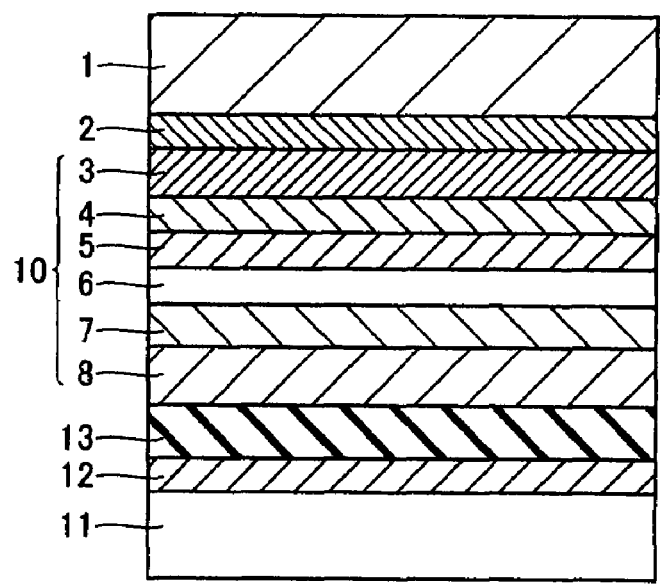
Figure 5:
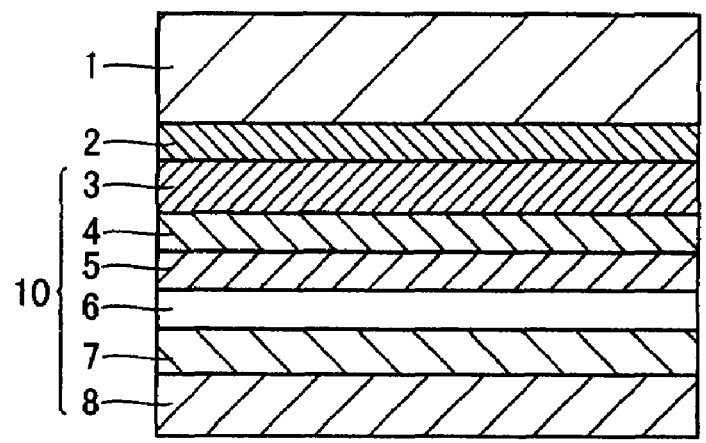

As shown in FIG. 4, the conductive substrate 1 having the thickness of about 50 μm to about 2 mm and containing copper and copper oxide mixed with each other at the ratio of 20:80 is boned to the upper surface of the p-side electrode 2. At this time, the conductive substrate 1 may be bonded to the upper surface of the p-side electrode 2 through solder of Au—Sn or Pd—Sn or through conductive paste of Ag. The solder or the conductive paste is an example of the "conductive material" in the present invention. Alternatively, the conductive substrate 1 may be directly pasted onto the upper surface of the p-side electrode 2 and pressurized under a temperature condition of about 400° C. to about 1000° C., to be bonded to the upper surface of the p-side electrode 2. Further alternatively, the conductive substrate 1 may be bonded to the upper surface of the p-side electrode 2 by anodic bonding applying an electric field to the conductive substrate 1. Thereafter the sapphire substrate 11 is removed by polishing or laser irradiation. Thereafter the buffer layer 12 and the underlayer 13 are removed by dry etching through $CF_4$ gas or the like or wet etching through a hot phosphoric acid solution or the like. Thus, the surface of the n-type contact layer 8 is exposed as shown in FIG. 5.

Figure 6:
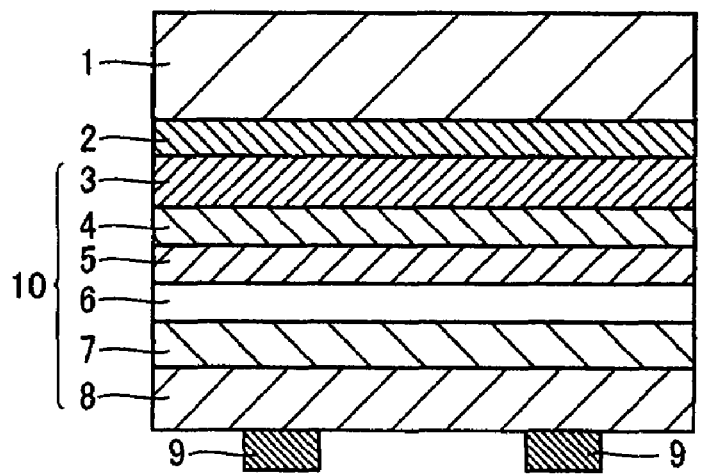

As shown in FIG. 6, the n-side electrode 9 is formed on the prescribed region of the exposed surface of the n-type contact layer 8 by vacuum evaporation or the like. At this time, the Al layer having the thickness of about 10 nm, the Pd layer having the thickness of about 10 nm and the Au layer having the thickness of about 100 nm are formed in this order for forming the n-side electrode 9.

Figure 7:
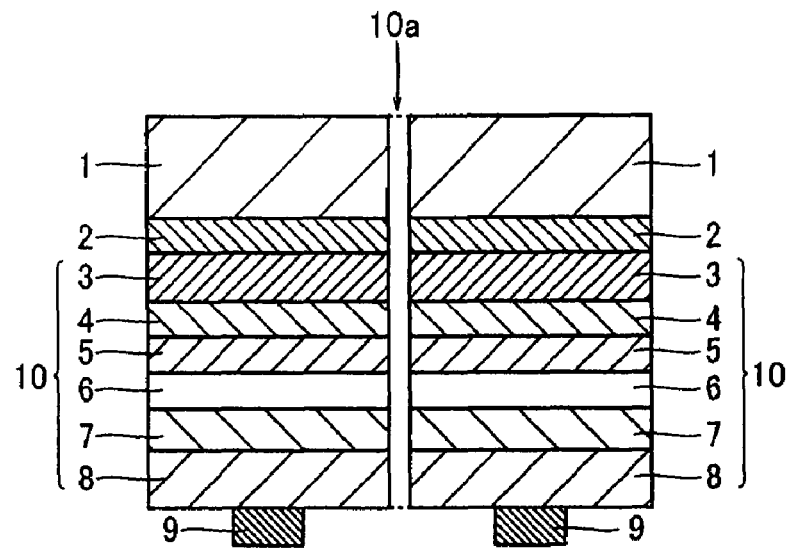

As shown in FIG. 7, the device is separated from an adjacent device along a separation region 10a. At this time, the separation region 10a may be notched through dicing, for separating the device from the adjacent device along the notch. Alternatively, the separation region 10a may be notched through etching, for separating the device from the adjacent device along the notch. Further alternatively, the separation region 10a of the conductive substrate 1 may be notched through dicing while notching the separation region 10a of the nitride-based semiconductor element layer 10 through etching, for separating the device from the adjacent device along the notches formed through dicing and etching respectively. When dicing and etching are combined with each other in the aforementioned manner, no cutting tool comes into contact with the nitride-based semiconductor element layer 10, and hence damage on the nitride-based semiconductor element layer 10 is reduced. Thus, the nitride-based light-emitting diode device according to the first embodiment is formed as shown in FIG. 1.

According to the first embodiment, as hereinabove described, the conductive substrate 1 is so formed as to contain copper and copper oxide mixed with each other at the ratio of 20:80, whereby the conductive substrate 1 can be provided with high thermal conductivity similar to that of copper. When a high current is fed to the nitride-based light-emitting diode device, therefore, heat generated in the nitride-based semiconductor element layer 10 bonded to the conductive substrate 1 can be sufficiently radiated toward the conductive substrate 1, whereby reduction of the light output characteristic caused by heat can be suppressed. Consequently, the nitride-based light-emitting diode device can be provided with a high rated output. Further, the linear expansion coefficient of the conductive substrate 1 can be so approached to that of the nitride-based semiconductor element layer 10 that the difference between the linear expansion coefficients of the conductive substrate 1 and the nitride-based semiconductor element layer 10 can be reduced. Thus, the nitride-based light-emitting diode device can be inhibited from warping or cracking resulting from large difference between the linear expansion coefficients of the conductive substrate 1 and the nitride-based semiconductor element layer 10 in the manufacturing process, whereby reduction of the manufacturing yield can be suppressed. In addition, the conductive substrate 1 is so employed that the p-side electrode 2 and the n-side electrode 9 can be oppositely arranged through the nitride-based semiconductor element layer 10. Thus, the emission area can be increased as compared with a nitride-based semiconductor light-emitting diode device employing an insulating substrate having two electrodes arranged only on one side of a nitride-based semiconductor element layer, whereby the light output characteristic can be improved. Further, the nitride-based light-emitting diode device may not be assembled by flip chip bonding requiring precise position control for improving the light output characteristic, whereby reduction of the manufacturing yield can be suppressed also by this.

Second Embodiment

Figure 8:
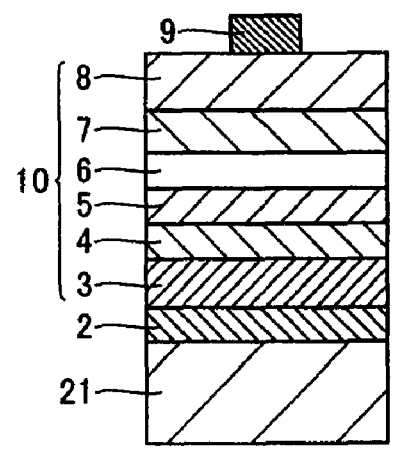
FIG. 8 is a sectional view showing the structure of a nitride-based light-emitting diode device according to a second embodiment of the present invention.

Referring to FIG. 8, a nitride-based light-emitting diode device according to a second embodiment of the present invention employs a conductive substrate 21 containing copper and copper oxide mixed with each other at a ratio of 70:30, dissimilarly to the aforementioned first embodiment.

In the nitride-based light-emitting diode device according to the second embodiment, a p-side electrode 2 having a composition and a thickness similar to those in the aforementioned first embodiment is bonded to the conductive substrate 21 containing copper and copper oxide mixed with each other at the ratio of 70:30, as shown in FIG. 8. Further, a nitride-based semiconductor element layer 10 constituted of layers 3 to 8 having compositions and thicknesses similar to those in the aforementioned first embodiment respectively is formed on the p-side electrode 2. An n-side electrode 9 having a composition and a thickness similar to those in the aforementioned first embodiment is formed on a prescribed region of the n-type contact layer 8 constituting the nitride-based semiconductor element layer 10.

A manufacturing process for the nitride-based light-emitting diode device according to the second embodiment is now described with reference to FIGS. 8 to 12.

Figure 9:
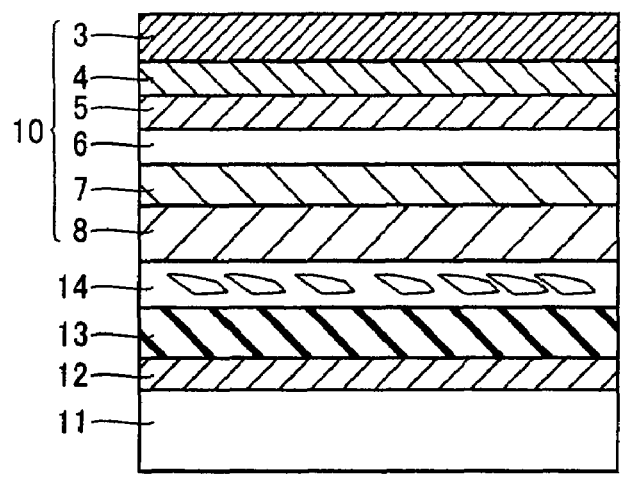
FIGS. 9 to 12 are sectional views for illustrating a manufacturing process for the nitride-based light-emitting diode device according to the second embodiment shown in FIG. 8.

As shown in FIG. 9, a buffer layer 12 and an underlayer 13 having compositions and thicknesses similar to those in the aforementioned first embodiment are successively grown on the (0001) plane of a sapphire substrate 11 serving as a growth substrate by MOCVD, similarly to the aforementioned first embodiment. Thereafter an isolation layer (gap layer) 14 of InGaN or AlGaN having a thickness of about 1 nm to about 1 μm and including spaces therein is formed on the underlayer 13. At this time, the spaces may be formed in the isolation layer 14 by anodic oxidation or etching, or the isolation layer 14 may be formed as a porous or amorphous layer inferior in crystallinity (having a large number of cracks). The porous isolation layer 14 can be formed by adjusting growth conditions, or implanting ions. The amorphous isolation layer 14 can be formed by low-temperature growth. Alternatively, the isolation layer 14 may be formed by a metal film or an insulating film having clearances. The isolation layer 14 formed by a metal film or an insulating film having clearances can also be employed as a mask for laterally growing the nitride-based semiconductor element layer 10. Then, the n-type contact layer 8, the n-type cladding layer 7, the active layer 6, the cap layer 5, the p-type cladding layer 4 and the p-type contact layer 3 having the compositions and the thicknesses similar to those in the aforementioned first embodiment are successively grown on the isolation layer 14, and the p-type cladding layer 4 and the p-type contact layer 3 are thereafter converted to the p type.

Figure 10:
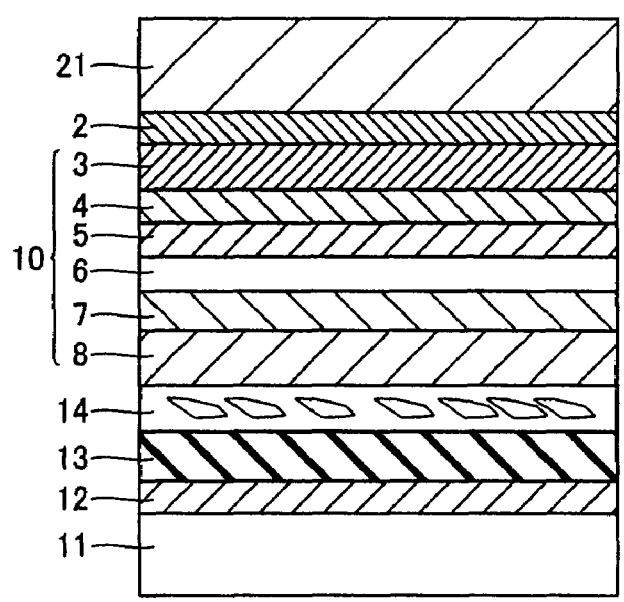
Figure 11:
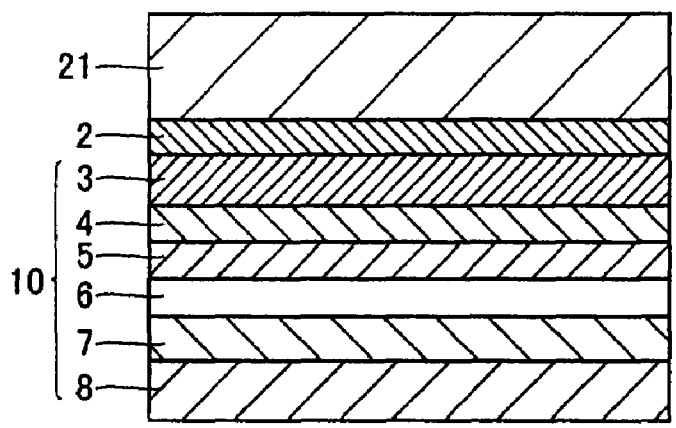

As shown in FIG. 10, the p-type electrode 2 having the composition and the thickness similar to those in the aforementioned first embodiment is formed on the p-type contact layer 3 by vacuum evaporation or the like, and the conductive substrate 21 containing copper and copper oxide mixed with each other at the ratio of 70:30 is bonded onto the upper surface of the p-side electrode 2 through a process similar to that of the first embodiment shown in FIG. 4. Thereafter the nitride-based semiconductor element layer 10 located on the isolation layer 14 is isolated from the layers (the sapphire substrate 11, the buffer layer 12 and the underlayer 13) located under the isolation layer 14. At this time, the isolation layer 14 may be removed by wet etching through a mixture of an HF solution and an $HNO_3$ solution, or by externally applying physical force. Alternatively, the nitride-based semiconductor element layer 10 located on the isolation layer 14 and the layers (11 to 13) located under the isolation layer 14 may be pulled in opposite directions, to be isolated from each other. Further alternatively, the isolation layer 14 may be removed by heating and melting the same by a method such as laser irradiation. Thus, the surface of the n-type contact layer 8 is exposed as shown in FIG. 11.

Figure 12:
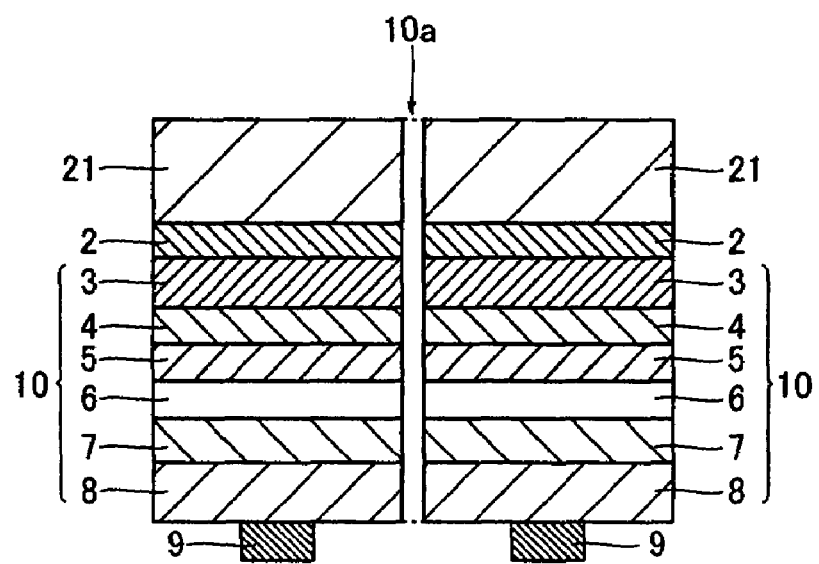

As shown in FIG. 12, the n-side electrode 9 having the composition and the thickness similar to those in the aforementioned embodiment is formed on the prescribed region of the exposed surface of the n-type contact layer 8 by vacuum evaporation or the like, and the device is separated from an adjacent device along a separation region 10a through a process similar to that of the first embodiment shown in FIG. 7. Thus, the nitride-based light-emitting diode device according to the second embodiment is formed as shown in FIG. 8.

According to the second embodiment, as hereinabove described, the conductive substrate 21 is so formed as to contain copper and copper oxide mixed with each other at the ratio of 70:30, whereby the conductive substrate 21 can be provided with high thermal conductivity similar to that of copper while the linear expansion coefficient of the conductive substrate 21 can be approached to that of the nitride-based semiconductor element layer 10. The conductive substrate 21 employed in the second embodiment has a higher percentage of copper and a lower percentage of copper oxide as compared with the conductive substrate 1 containing copper and copper oxide mixed with each other at the ratio of 20:80 in the aforementioned first embodiment. In the conductive substrate 21 employed in the second embodiment, therefore, the thermal conductivity as well as the linear expansion coefficient are higher than those in the conductive substrate 1 employed in the aforementioned first embodiment. Thus, heat generated in the nitride-based semiconductor element layer 10 bonded to the conductive substrate 21 can be further sufficiently radiated toward the conductive substrate 21 as compared with the aforementioned first embodiment, whereby reduction of the light output characteristic caused by heat can be more suppressed as compared with the first embodiment. In the second embodiment, on the other hand, the difference between the linear expansion coefficients of the conductive substrate 21 and the nitride-based semiconductor element layer 10 is larger than that in the aforementioned first embodiment, and hence an effect of inhibiting the nitride-based light-emitting diode device from warping is reduced as compared with that in the first embodiment.

The remaining effects of the second embodiment are similar to those of the aforementioned first embodiment.

Third Embodiment

Figure 13:
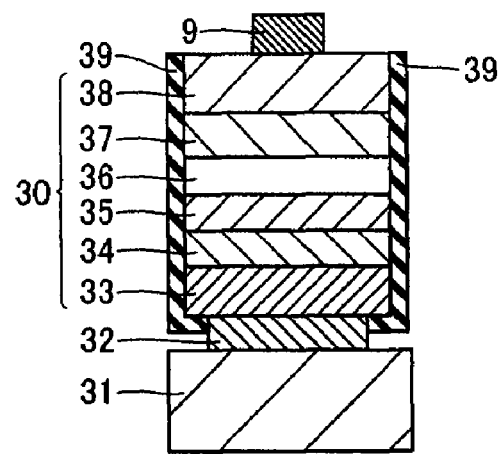
FIG. 13 is a sectional view showing the structure of a nitride-based light-emitting diode device according to a third embodiment of the present invention.

Referring to FIG. 13, a nitride-based light-emitting diode device according to a third embodiment of the present invention employs a conductive substrate 31 having thermal conductivity of about 170 W/m·K and containing copper and copper oxide mixed with each other at a ratio of 60:40, dissimilarly to the aforementioned first and second embodiments.

In the nitride-based light-emitting diode device according to the third embodiment, a p-side electrode 32 having a composition and a thickness similar to those of the p-side electrode 2 in the aforementioned first embodiment with a width smaller than that of the conductive substrate 31 is bonded to the conductive substrate 31 having the thermal conductivity of about 170 W/m·K and containing copper and copper oxide mixed with each other at the ratio of 60:40, as shown in FIG. 13. The p-side electrode 32 is an example of the "electrode" in the present invention. A p-type contact layer 33, a p-type cladding layer 34, a cap layer 35, an active layer 36, an n-type cladding layer 37 and an n-type contact layer 38 each having a width smaller than that of the conductive substrate 31 and larger than that of the p-side electrode 32 are successively formed on the p-side electrode 32. The p-type contact layer 33, the p-type cladding layer 34, the cap layer 35, the active layer 36, the n-type cladding layer 37 and the n-type contact layer 38 have compositions and thicknesses similar to those of the p-type contact layer 3, the p-type cladding layer 4, the cap layer 5, the active layer 6, the n-type cladding layer 7 and the n-type contact layer 8 in the aforementioned first embodiment respectively. The p-type contact layer 33, the p-type cladding layer 34, the cap layer 35, the active layer 36, the n-type cladding layer 37 and the n-type contact layer 38 constitute a nitride-based semiconductor element layer 30. A protective film 39 of $SiO_2$, SiN, $TiO_2$ or ZrO having a thickness of about 300 nm is formed to cover regions other than the upper surface of the nitride-based semiconductor element layer 30 (the n-type contact layer 38). An n-side electrode 9 having a composition and a thickness similar to those in the aforementioned first embodiment is formed on a prescribed region of the n-type contact layer 38 constituting the nitride-based semiconductor element layer 30.

A manufacturing process for the nitride-based light-emitting diode device according to the third embodiment is now described with reference to FIGS. 13 to 19.

Figure 14:
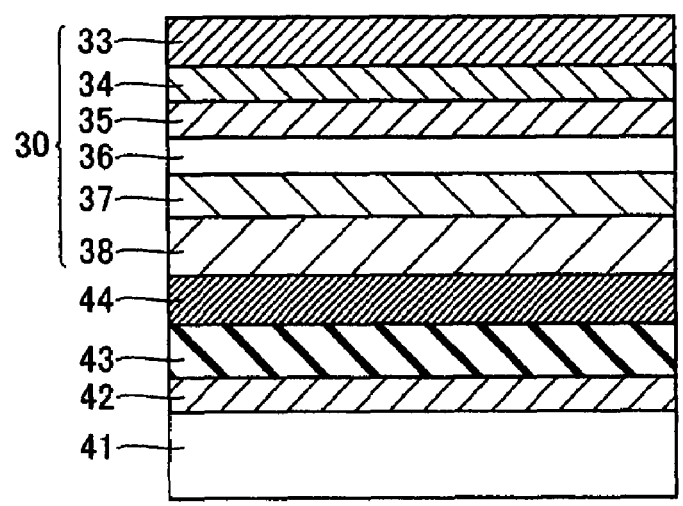
FIGS. 14 to 19 are sectional views for illustrating a manufacturing process for the nitride-based light-emitting diode device according to the third embodiment shown in FIG. 13.

As shown in FIG. 14, a buffer layer 42 and an underlayer 43 are successively grown on an SiC substrate 41 serving as a growth substrate by MOCVD. The buffer layer 42 and the underlayer 43 have compositions and thicknesses similar to those of the buffer layer 12 and the underlayer 13 in the aforementioned first embodiment respectively. Thereafter an isolation layer 44 of InGaN having a high In composition ratio capable of efficiently absorbing a laser beam having a prescribed wavelength ($In_xGa_{x-1}N$ (X≧0.2) when employing a second harmonic YAG laser beam (wavelength: 532 nm), for example) is formed on the underlayer 43. Then, the n-type contact layer 38, the n-type cladding layer 37, the active layer 36, the cap layer 35, the p-type cladding layer 34 and the p-type contact layer 33 are successively grown on the isolation layer 44, and the p-type cladding layer 34 and the p-type contact layer 33 are thereafter converted to the p type.

Figure 15:
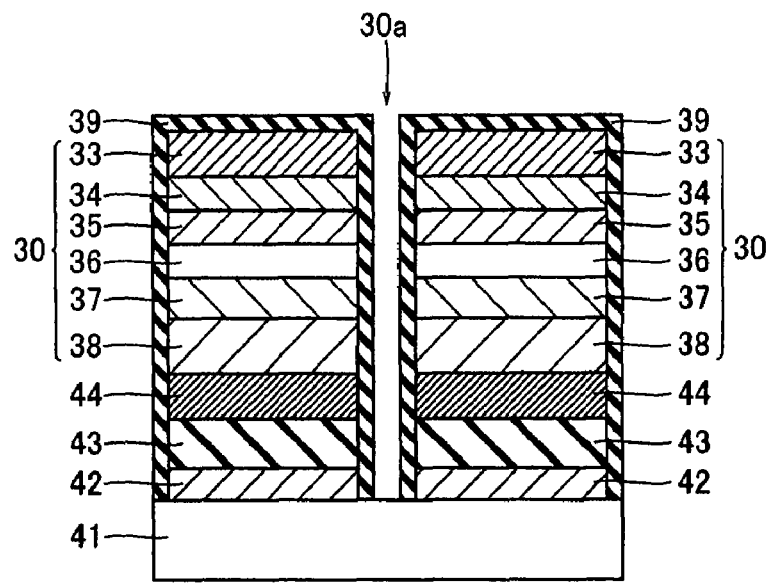

As shown in FIG. 15, a trench having a depth reaching the SiC substrate 41 is formed in a separation region 30a through etching, thereby parting the nitride-based semiconductor element layer 30 through the trench. Alternatively, the trench formed in the separation region 30a may not reach the SiC substrate 41. Thereafter the protective film 39 is formed by CVD to cover the nitride-based semiconductor element layer 30, the isolation layer 44, the buffer layer 42 and the underlayer 43.

Figure 16:
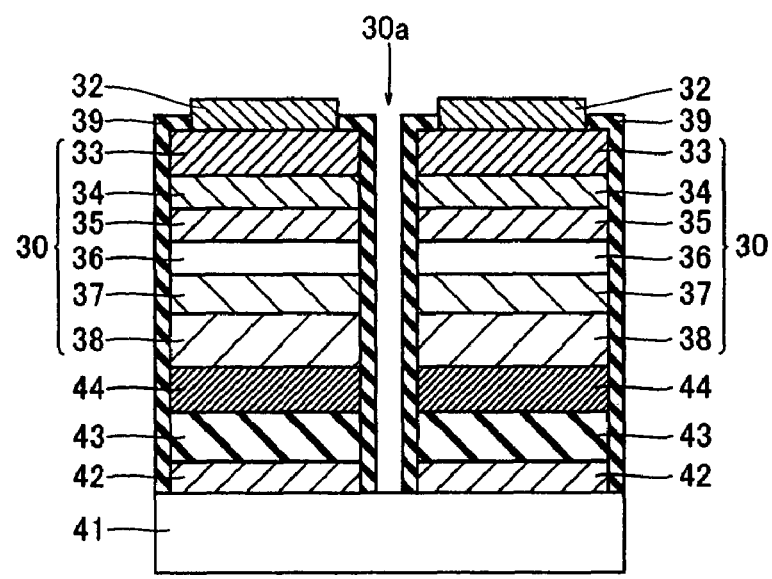

As shown in FIG. 16, a prescribed region of the protective film 39 located on the upper surface of the p-type contact layer 33 constituting the nitride-based semiconductor element layer 30 is removed, and the p-side electrode 32 is thereafter formed on the exposed upper surface of the p-type contact layer 33 by vacuum evaporation or the like.

Figure 17:
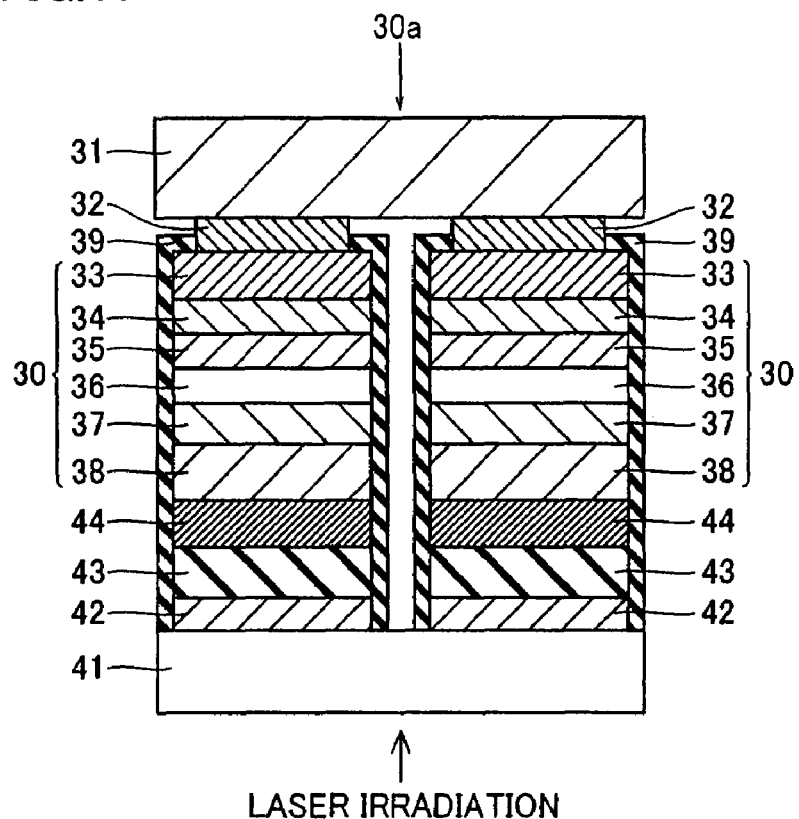

As shown in FIG. 17, the conductive substrate 31 having the thermal conductivity of about 170 W/m·K and containing copper and copper oxide mixed with each other at the ratio of 60:40 is bonded onto the upper surface of the p-side electrode 32 through a process similar to that of the first embodiment shown in FIG. 4. Thereafter the nitride-based semiconductor element layer 30 located on the isolation layer 44 is isolated from the layers (the SiC substrate 41, the buffer layer 42 and the underlayer 43) located under the isolation layer 44. At this time, a laser beam is applied through a high-output laser such as a YAG laser, a KrF excimer laser, a DPSS laser (semiconductor laser excited solid-state laser) or a nitrogen laser from the side of the SiC substrate 41, so that the isolation layer 44 absorbs light. Thus, the isolation layer 44 is so thermally decomposed as to isolate the nitride-based semiconductor element layer 30 located thereon from the layers (41 to 43) located under the same.

Figure 18:
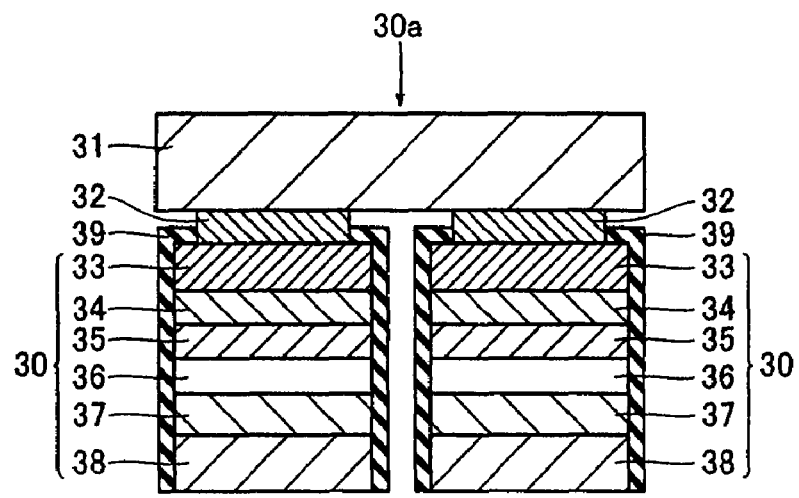

According to the third embodiment, the isolation layer 44 is made of $In_{0.5}Ga_{0.5}N$, and a second harmonic laser beam (wavelength: 532 nm) is applied through a YAG laser from the side of the SiC substrate 41 so that the isolation layer 44 absorbs the laser beam transmitted through the SiC substrate 41, the buffer layer 42 and the underlayer 43. Thus, isolation through the isolation layer 44 can be simplified by properly designing the band gap of the isolation layer 44 and the wavelength of the applied laser beam. Among the semiconductor layers shown in FIG. 17, therefore, the isolation layer 44 can most efficiently absorb the laser beam, so that isolation can be easily performed through the isolation layer 44. Thus, the surface of the n-type contact layer 38 is exposed as shown in FIG. 18.

Figure 19:
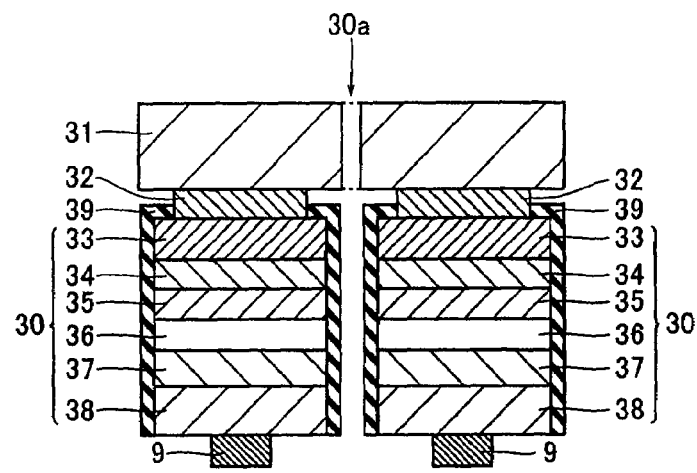

As shown in FIG. 19, the n-side electrode 9 having the composition and the thickness similar to those in the aforementioned first embodiment is formed on the prescribed region of the exposed surface of the n-type contact layer 38 by vacuum evaporation or the like, and the device is separated from an adjacent device along a separation region 30a through a process similar to that of the first embodiment shown in FIG. 7. Thus, the nitride-based light-emitting diode device according to the third embodiment is formed as shown in FIG. 13.

Results of investigation of the relation between an applied current and the light output as to a sample of the nitride-based light-emitting diode device according to the third embodiment prepared in practice along the aforementioned manufacturing process are now described. The relation between applied currents and light outputs was also investigated as to samples of nitride-based light-emitting diode devices employing conductive substrates having thermal conductivity of about 100 W/m·K and thermal conductivity of about 80 W/m·K respectively, in addition to the sample of the nitride-based light-emitting diode device according to the third embodiment employing a conductive substrate having thermal conductivity of about 170 W/m·K. In these samples, the thermal conductivity of about 100 W/m·K and the thermal conductivity of about 80 W/m·K of the conductive substrates were adjusted by adjusting mixing ratios between copper and copper oxide respectively.

Figure 20:
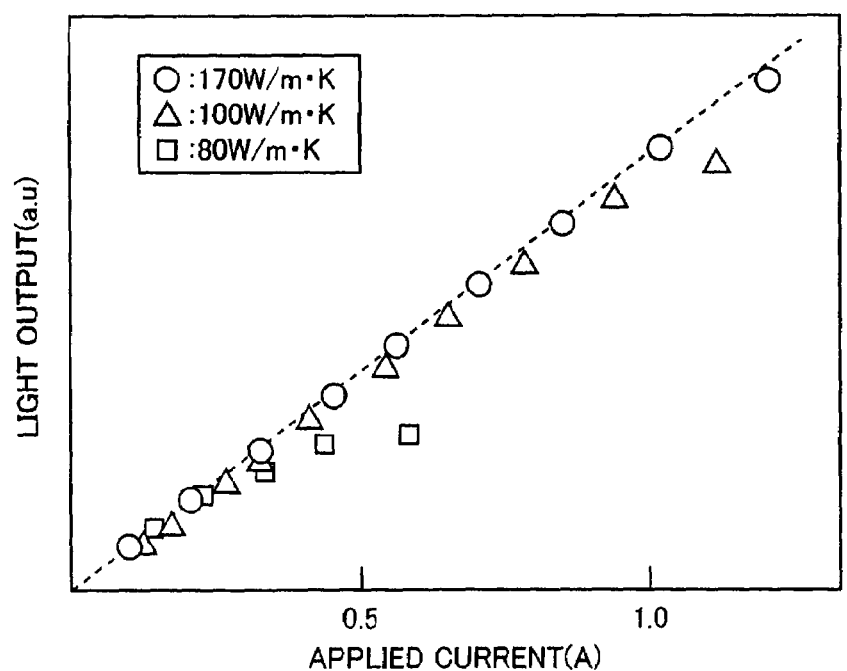
FIG. 20 is a graph showing the relation between currents applied to nitride-based light-emitting diode devices employing three types of conductive substrates different in thermal conductivity from each other respectively and light outputs thereof.

FIG. 20 shows the relation between the applied currents and the light outputs in the samples of the nitride-based light-emitting diode devices employing the three types of conductive substrates different in thermal conductivity from each other. Referring to FIG. 20, the axis of ordinates shows the light outputs of an arbitrary unit (a.u.), and the axis of abscissas shows the applied currents (A).

Referring to FIG. 20, it has been proved that the light output is increased in proportion to the applied current in the sample of the nitride-based light-emitting diode device according to the third embodiment employing the conductive substrate having the thermal conductivity of about 170 W/m·K also when the applied current exceeds 1.0 A. It has also been proved that the light output is increased in proportion to the applied current also in the sample of the nitride-based light-emitting diode device employing the conductive substrate having the thermal conductivity of about 100 W/m·K similarly to the aforementioned sample of the nitride-based light-emitting diode device according to the third embodiment until the applied current reaches a value close to 1.0 A. On the other hand, it has been proved that the light output cannot keep proportional relation to the applied current in the sample of the nitride-based light-emitting diode device employing the conductive substrate having the thermal conductivity of about 80 W/m·K when the applied current exceeds about 0.5 A. It is conceivable from these results that the light output is increased in proportion to the applied current also when the applied current exceeds 0.5 A, if the thermal conductivity of the conductive substrate is at least about 100 W/m·K.

According to the third embodiment, as hereinabove described, the conductive substrate 31 is so formed as to contain copper and copper oxide mixed with each other at the ratio of 60:40, whereby heat generated in the nitride-based semiconductor element layer 30 bonded to the conductive substrate 31 can be easily sufficiently radiated toward the conductive substrate 31 when a high current of at least 0.5 A is fed to the nitride-based light-emitting diode device by setting the thermal conductivity of the conductive substrate 31 to about 170 W/m·K and hence reduction of the light output characteristic caused by heat can be easily suppressed. Consequently, the nitride-based light-emitting diode device can be provided with a high rated output.

The remaining effects of the third embodiment are similar to those of the aforementioned first embodiment.

Fourth Embodiment

Figure 21:
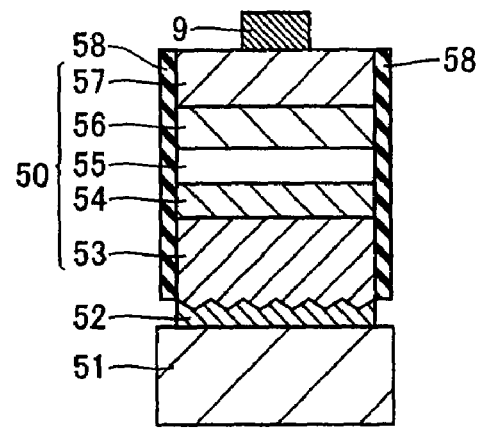
FIG. 21 is a sectional view showing the structure of a nitride-based light-emitting diode device according to a fourth embodiment of the present invention.

Referring to FIG. 21, a nitride-based light-emitting diode device according to a fourth embodiment of the present invention employs a conductive substrate 51 having a Young's modulus of about 50 GPa and containing copper and copper oxide mixed with each other at a ratio of 45:55.

In the nitride-based light-emitting diode device according to the fourth embodiment, a p-side electrode 52 having a textured surface with a width smaller than that of the conductive substrate 51 is bonded to the conductive substrate 51 containing copper and copper oxide mixed with each other at the ratio of 45:55, as shown in FIG. 21. The p-side electrode 52 has a composition and a thickness similar to those of the p-side electrode 2 in the aforementioned first embodiment. The width of portions between the centers of adjacent projecting and recess portions of the textured surface of the p-side electrode 52 is about 0.1 μm to about 50 μm, and the height of the projecting portions with reference to the bottoms of the recess portions is about 1 nm to about 2 μm. The p-side electrode 52 is an example of the "electrode" in the present invention. A p-type contact layer 53 having a function for serving as a cladding layer is formed on the p-side electrode 52 to fill up the recess portions on the surface of the p-side electrode 52. This p-type contact layer 53 consists of GaN, AlGaN or InGaN doped with Mg, and has a thickness of about 1 nm to about 1 μm. A cap layer 54, an active layer 55, an n-type cladding layer 56 and an n-type contact layer 57 are successively formed on the p-type contact layer 53. The cap layer 54, the active layer 55, the n-type cladding layer 56 and the n-type contact layer 57 have compositions and thicknesses similar to those of the cap layer 5, the active layer 6, the n-type cladding layer 7 and the n-type contact layer 8 in the aforementioned first embodiment respectively. The p-type contact layer 53, the cap layer 54, the active layer 55, the n-type cladding layer 56 and the n-type contact layer 57 constitute a nitride-based semiconductor element layer 50. A protective film 58 having a composition and a thickness similar to those of the protective film 39 in the aforementioned third embodiment is formed on the side surfaces of the nitride-based semiconductor element layer 50. An n-side electrode 9 having a composition and a thickness similar to those in the aforementioned first embodiment is formed on a prescribed region of the n-type contact layer 57 constituting the nitride-based semiconductor element layer 50.

A manufacturing process for the nitride-based light-emitting diode device according to the fourth embodiment is now described with reference to FIGS. 21 to 27.

Figure 22:
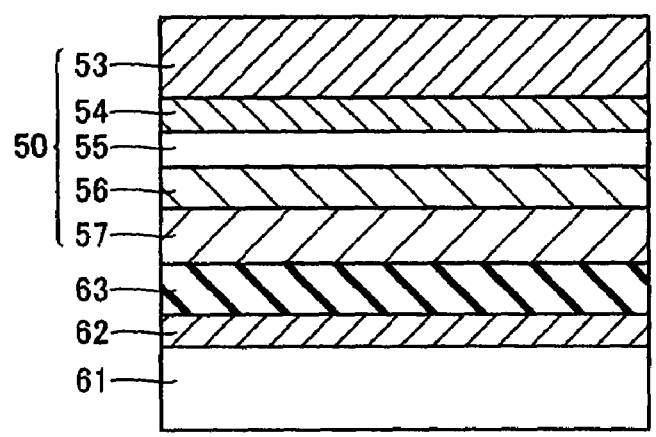
FIGS. 22 to 27 are sectional views for illustrating a manufacturing process for the nitride-based light-emitting diode device according to the fourth embodiment shown in FIG. 21.

As shown in FIG. 22, a buffer layer 62 and an underlayer 63 are successively grown on an Si substrate 61 serving as a growth substrate by MOCVD. The buffer layer 62 and the underlayer 63 have compositions and thicknesses similar to those of the buffer layer 12 and the underlayer 13 in the aforementioned first embodiment respectively. Then, the p-type contact layer 57, the n-type cladding layer 56, the active layer 55, the cap layer 54 and the p-type contact layer 53 are successively grown on the underlayer 63, and the p-type contact layer 53 is thereafter converted to the p type.

Figure 23:
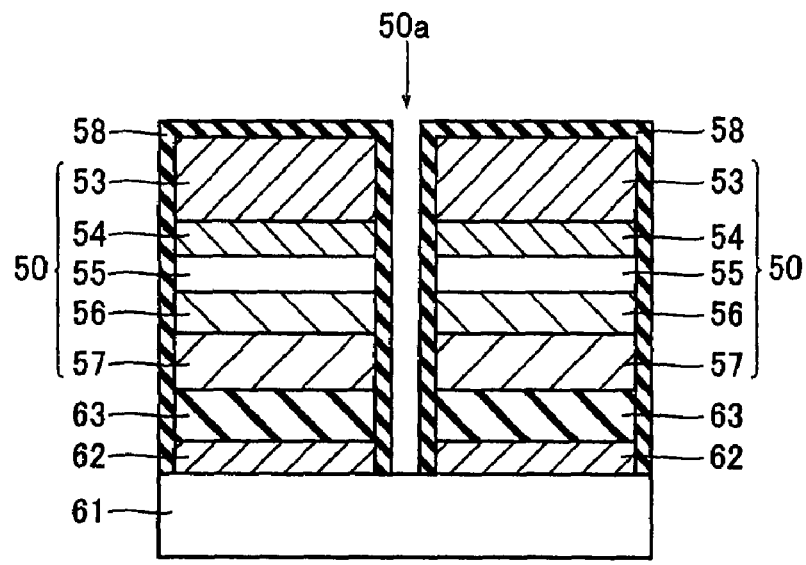

As shown in FIG. 23, a trench having a depth reaching the Si substrate 61 is formed in a separation region 50a by etching, thereby parting the nitride-based semiconductor element layer 50 through the trench. Thereafter the protective film 58 is formed by CVD to cover the nitride-based semiconductor element layer 50, the buffer layer 62 and the underlayer 63.

Figure 24:
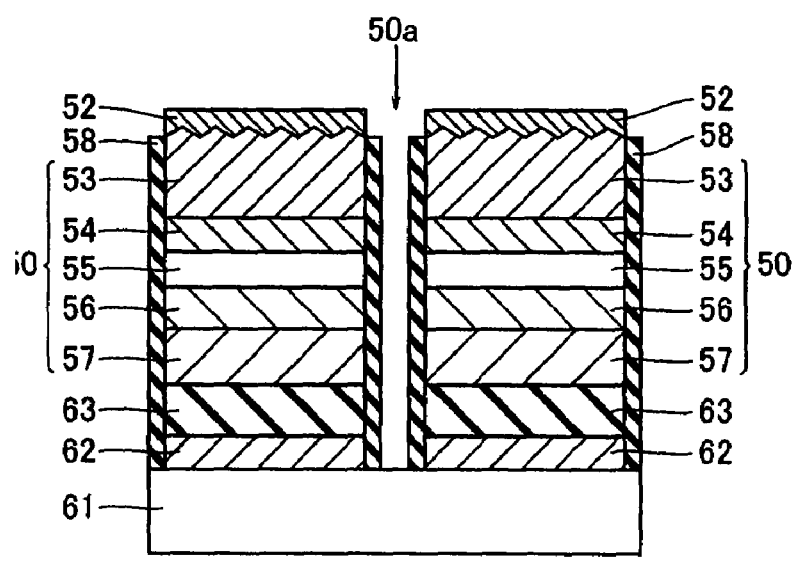

As shown in FIG. 24, the portion of the protective film 58 located on the upper surface of the p-type contact layer 53 is removed, and the exposed surface of the p-type contact layer 53 is thereafter textured by photolithography and dry etching. At this time, the surface of the p-type contact layer 53 is so textured that the width of the portions between the centers of the adjacent projecting and recess portions of the textured surface of the p-type contact layer 53 is about 0.1 μm to about 50 μm and the height of the projecting portions with reference to the bottoms of the recess portions is about 1 nm to about 2 μm. Thereafter the p-side electrode 52 is formed by vacuum evaporation or the like to fill up the recess portions on the surface of the p-type contact layer 53.

Figure 25:
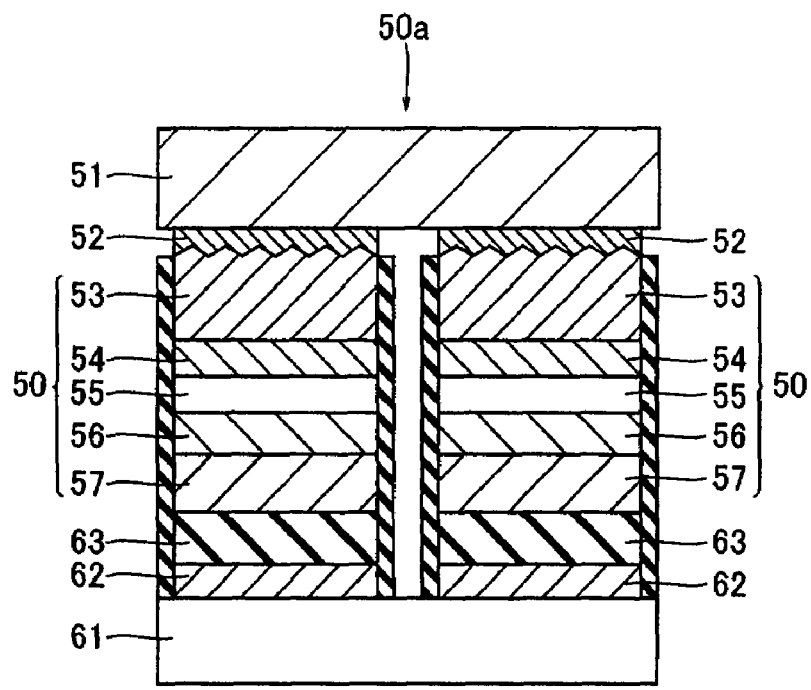
Figure 26:
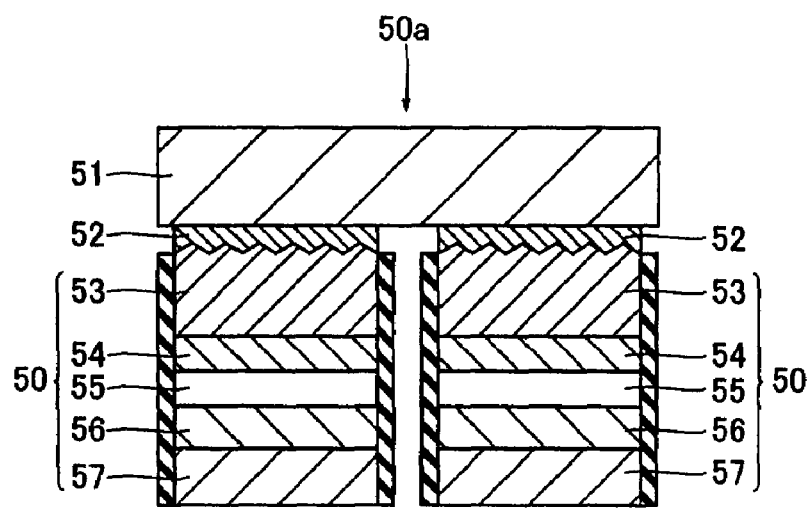

As shown in FIG. 25, the conductive substrate 51 having the Young's modulus of about 50 GPa and containing copper and copper oxide mixed with each other at the ratio of 45:55 is bonded onto the upper surface of the p-side electrode 52 through solder (not shown) of Au—Sn. Thereafter the Si substrate 61, the buffer layer 62 and the underlayer 63 are removed by wet etching through a hot phosphoric acid solution or the like. Thus, the surface of the n-type contact layer 57 is exposed as shown in FIG. 26.

Figure 27:
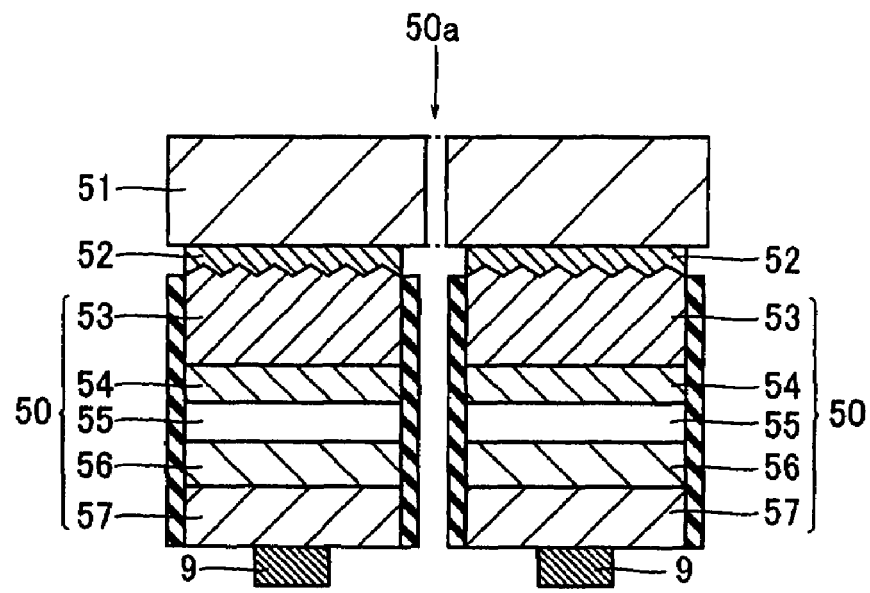

As shown in FIG. 27, the n-side electrode 9 having the composition and the thickness similar to those in the aforementioned first embodiment is formed on the prescribed region of the exposed surface of the n-type contact layer 57 by vacuum evaporation or the like, and the device is separated from an adjacent device along the separation region 50a through a process similar to that of the first embodiment shown in FIG. 7. Thus, the nitride-based light-emitting diode device according to the fourth embodiment is formed as shown in FIG. 21.

Table 1 shows results of an experiment for investigating presence/absence of cracks on nitride-based semiconductor element layers with reference to five conductive substrates having different Young's moduli (about 100 GPa, about 110 GPa, about 120 GPa, about 130 GPa and about 140 GPa) respectively. The Young's moduli of about 100 GPa, about 110 GPa, about 120 GPa, about 130 GPa and about 140 GPa were adjusted by adjusting the mixing ratios of copper and copper oxide contained in the conductive substrates respectively. Further, the Young's moduli of about 130 GPa and about 140 GPa were adjusted by employing other conductive metals.

TABLE 1

| Young's Modulus (GPa) | Crack |
|---|---|
| 100 | no |
| 110 | no |
| 120 | no |
| 130 | yes |
| 140 | yes |

Referring to Table 1, it has been proved that no cracks were formed on the nitride-based semiconductor element layers bonded to the conductive substrates having the Young's moduli of about 100 GPa, about 110 GPa and about 120 GPa respectively. On the other hand, it has been proved that the nitride-based semiconductor element layers bonded to the conductive substrates having the Young's moduli of about 130 GPa and about 140 GPa respectively were cracked. It is conceivable from these results that the nitride-based semiconductor element layer can be inhibited from cracking when the Young's modulus of the conductive substrate is not more than about 120 GPa.

According to the fourth embodiment, the conductive substrate 51 has the Young's modulus of about 50 GPa, whereby the nitride-based semiconductor element layer 50 can conceivably be inhibited from cracking.

According to the fourth embodiment, as hereinabove described, the conductive substrate 51 is so formed as to contain copper and copper oxide mixed with each other at the ratio of 45:55, whereby the conductive substrate 51 having the Young's modulus set to about 50 GPa can be inhibited from deformation under stress. When the nitride-based semiconductor element layer 50 bonded to the conductive substrate 51 is separated from the Si substrate 61, therefore, the nitride-based semiconductor element layer 50 can be inhibited from deformation under stress caused by deformation under stress of the conductive substrate 51. Thus, the nitride-based semiconductor element layer 50 can be inhibited from cracking, whereby the manufacturing yield can be inhibited from reduction resulting from cracks formed in the nitride-based light-emitting diode device.

According to the fourth embodiment, further, the surface of the p-type contact layer 53 is so textured that light incident upon the interface between the p-type contact layer 53 and the p-side electrode 52 is easily reflected by the textured surface of the p-type contact layer 53. Thus, the reflected light is emitted from the n-side, whereby the light output characteristic can be improved.

The remaining effects of the fourth embodiment are similar to those of the aforementioned first embodiment.

Fifth Embodiment

Figure 28:
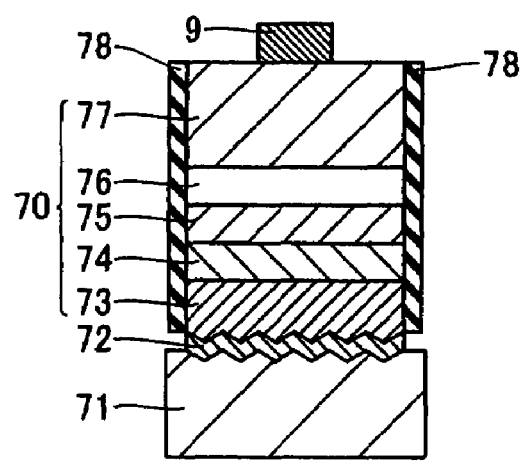
FIG. 28 is a sectional view showing the structure of a nitride-based light-emitting diode device according to a fifth embodiment of the present invention.

Referring to FIG. 28, a nitride-based light-emitting diode device according to a fifth embodiment of the present invention employs a conductive substrate 71 having a linear expansion coefficient of about $9.5 \times 10^{-6}$/K and containing copper and copper oxide mixed with each other at a ratio of 50:50.

According to the fifth embodiment, a p-side electrode 72 having a width smaller than that of the conductive substrate 71 is bonded to the conductive substrate 71 containing copper and copper oxide mixed with each other at the ratio of 50:50, as shown in FIG. 28. The conductive substrate 71 has a textured surface. The width of portions between the centers of adjacent projecting and recess portions of the textured surface of the conductive substrate 71 is about 0.1 μm to about 50 μm, and the height of the projecting portions with reference to the bottoms of the recess portions is about 1 nm to about 2 μm. The upper and lower surfaces of the p-side electrode 72 are textured similarly to the textured surface of the conductive substrate 71. Further, the positions of the recess portions (projecting portions) of the conductive substrate 71 coincide with the positions of the projecting portions (recess portions) of the p-side electrode 72. The p-side electrode 72 has a composition and a thickness similar to those of the p-side electrode 2 in the aforementioned first embodiment. The p-side electrode 72 is an example of the "electrode" in the present invention.

A p-type contact layer 73 is formed on the p-side electrode 72 to fill up the recess portions on the textured surface of the p-side electrode 72. A p-type cladding layer 74, a cap layer 75 and an active layer 76 are successively formed on the p-type contact layer 73. The p-type contact layer 73, the p-type cladding layer 74, the cap layer 75 and the active layer 76 have compositions and thicknesses similar to those of the p-type contact layer 3, the p-type cladding layer 4, the cap layer 5 and the active layer 6 in the aforementioned first embodiment respectively. An n-type cladding layer 77 having a function for serving as a contact layer is formed on the active layer 76. This n-type cladding layer 77 consists of AlGaN (Al composition ratio ≦50%) doped with Si or Ge, and has a thickness of about 1 nm to about 1 μm. The p-type contact layer 73, the p-type cladding layer 74, the cap layer 75, the active layer 76 and the n-type cladding layer 77 constitute a nitride-based semiconductor element layer 70. A protective film 78 having a composition and a thickness similar to those of the protective film 39 in the aforementioned third embodiment is formed on the side surfaces of the nitride-based semiconductor element layer 70. An n-side electrode 9 having a composition and a thickness similar to those in the aforementioned first embodiment is formed on a prescribed region of the n-type cladding layer 77 constituting the nitride-based semiconductor element layer 70.

A manufacturing process for the nitride-based light-emitting diode device according to the fifth embodiment is now described with reference to FIGS. 28 to 34.

Figure 29:
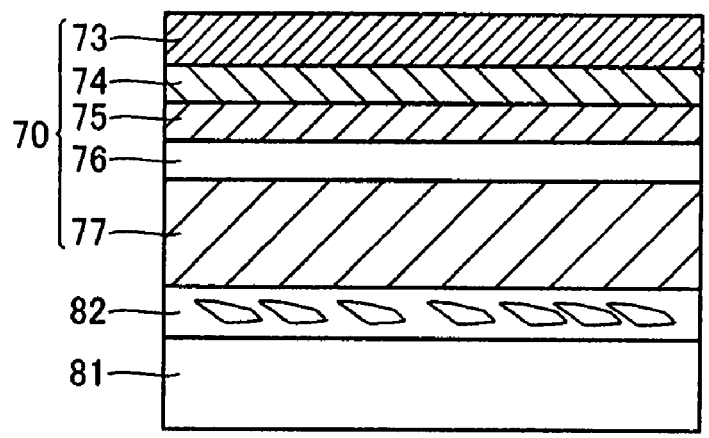
FIGS. 29 to 34 are sectional views for illustrating a manufacturing process for the nitride-based light-emitting diode device according to the fifth embodiment shown in FIG. 28.

As shown in FIG. 29, an isolation layer (gap layer) 82 having spaces therein is formed on a GaN substrate 81 serving as a growth substrate by MOCVD. The isolation layer 82 has a composition and a thickness similar to those of the isolation layer 14 in the aforementioned second embodiment. Then, the n-type cladding layer 77, the active layer 76, the cap layer 75, the p-type cladding layer 74 and the p-type contact layer 73 are successively grown on the isolation layer 82, and the p-type cladding layer 74 and the p-type contact layer 73 are thereafter converted to the p type.

Figure 30:
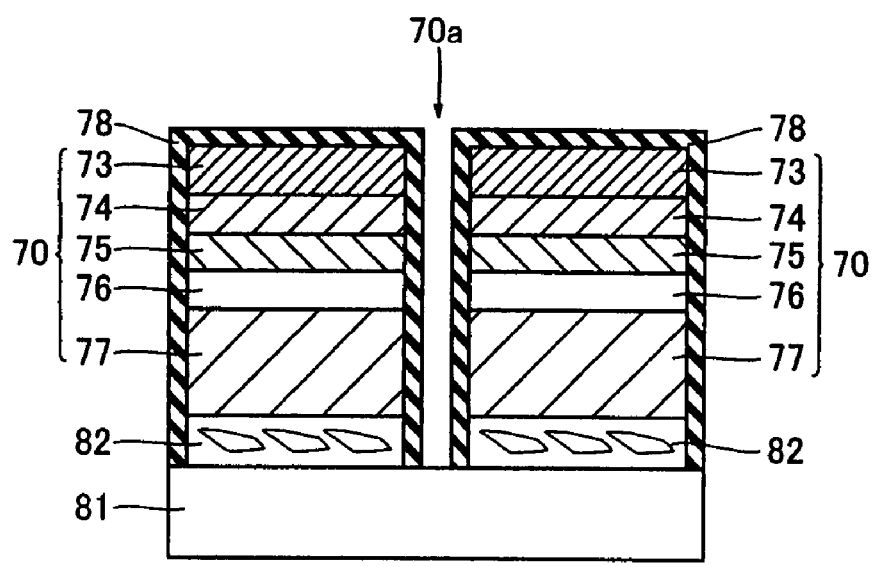

As shown in FIG. 30, a trench having a depth reaching the GaN substrate 81 is formed in a separation region 70a by etching, thereby parting the nitride-based semiconductor element layer 70 through the trench. Thereafter the protective film 78 is formed by CVD to cover the nitride-based semiconductor element layer 70 and the isolation layer 82.

Figure 31:
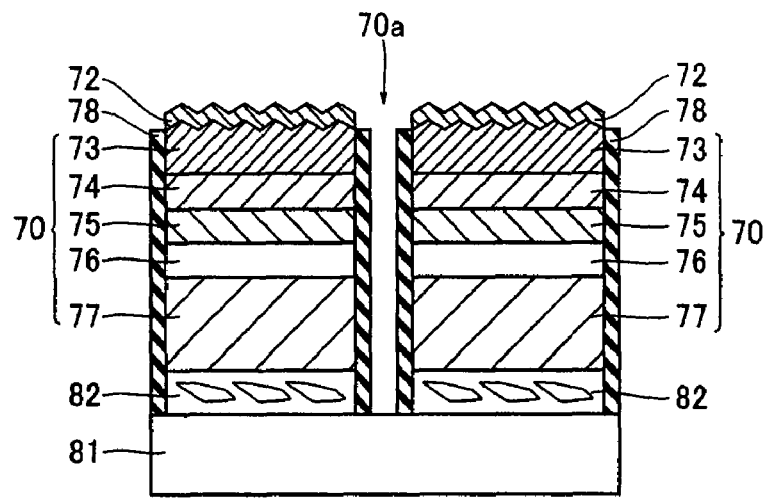

As shown in FIG. 31, the portion of the protective film 78 located on the upper surface of the p-type contact layer 73 constituting the nitride-based semiconductor element layer 70 is removed, and the exposed surface of the p-type contact layer 73 is thereafter textured by photolithography and dry etching. At this time, the surface of the p-type contact layer 73 is so textured that the width of the portions between the centers of the adjacent projecting and recess portions of the textured surface of the p-type contact layer 53 is about 0.1 μm to about 50 μm and the height of the projecting portions with reference to the bottoms of the recess portions is about 1 nm to about 2 μm. Thereafter the p-side electrode 72 is formed by vacuum evaporation or the like to fill up the recess portions on the surface of the p-type contact layer 73. At this time, the p-side electrode 72 is provided with the textured surfaces reflecting the texture on the surface of the p-type contact layer 73.

Figure 32:
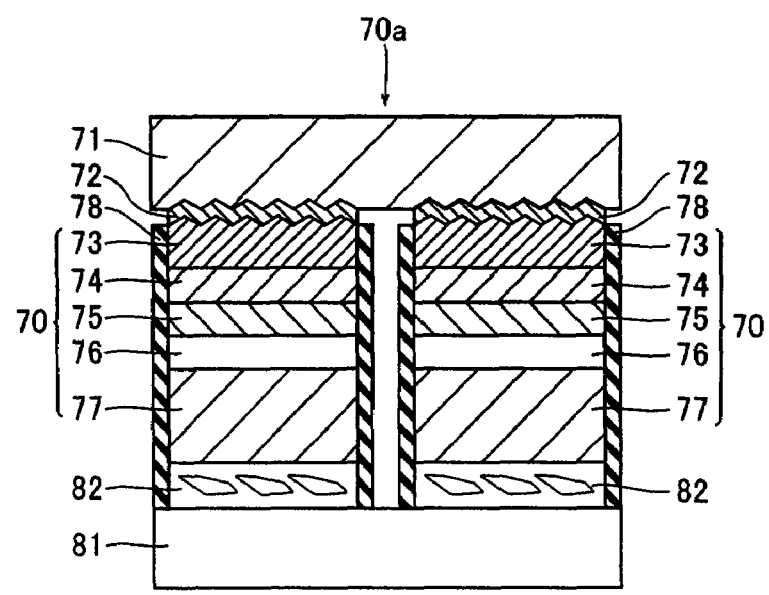
Figure 33:
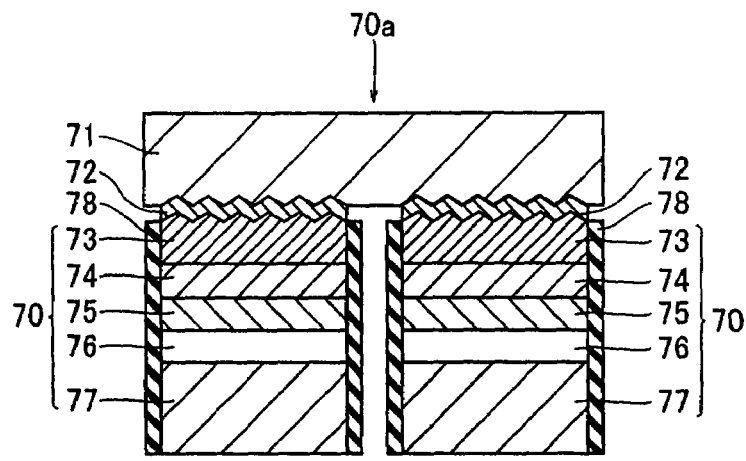

As shown in FIG. 32, the surface of the conductive substrate 71 having the linear expansion coefficient of about $9.5 \times 10^{-6}$/K and containing copper and copper oxide mixed with each other at the ratio of 50:50 is textured similarly to the textured surfaces of the p-side electrode 72 by embossing or the like. Thereafter the conductive substrate 71 is bonded onto the upper surface of the p-side electrode 72 through a process similar to that of the first embodiment shown in FIG. 4. At this time, the conductive substrate 71 is so is bonded onto the upper surface of the p-side electrode 72 that the positions of the recess portions (projecting portions) of the conductive substrate 71 coincide with the positions of the projecting portions (recess portions) of the p-side electrode 72. Thereafter the nitride-based semiconductor element layer 70 located on the isolation layer 82 is isolated from the GaN substrate 81 located under the isolation layer 82 through a process similar to that of the second embodiment shown in FIG. 10. Thus, the surface of the n-type cladding layer 77 is exposed as shown in FIG. 33.

Figure 34:
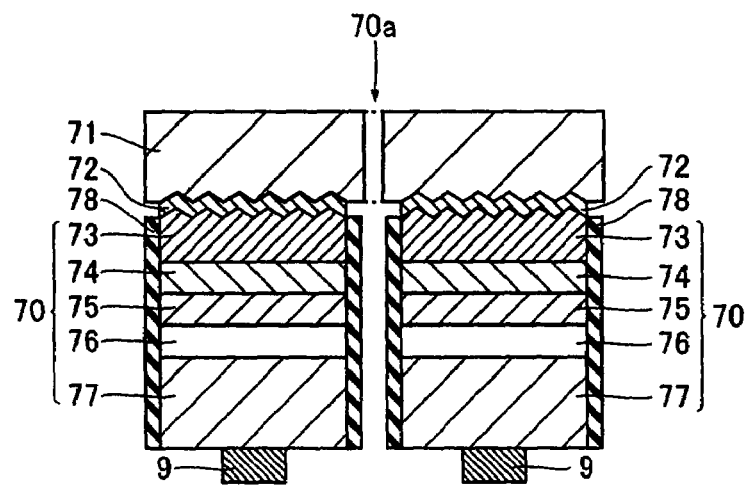
Figure 35:
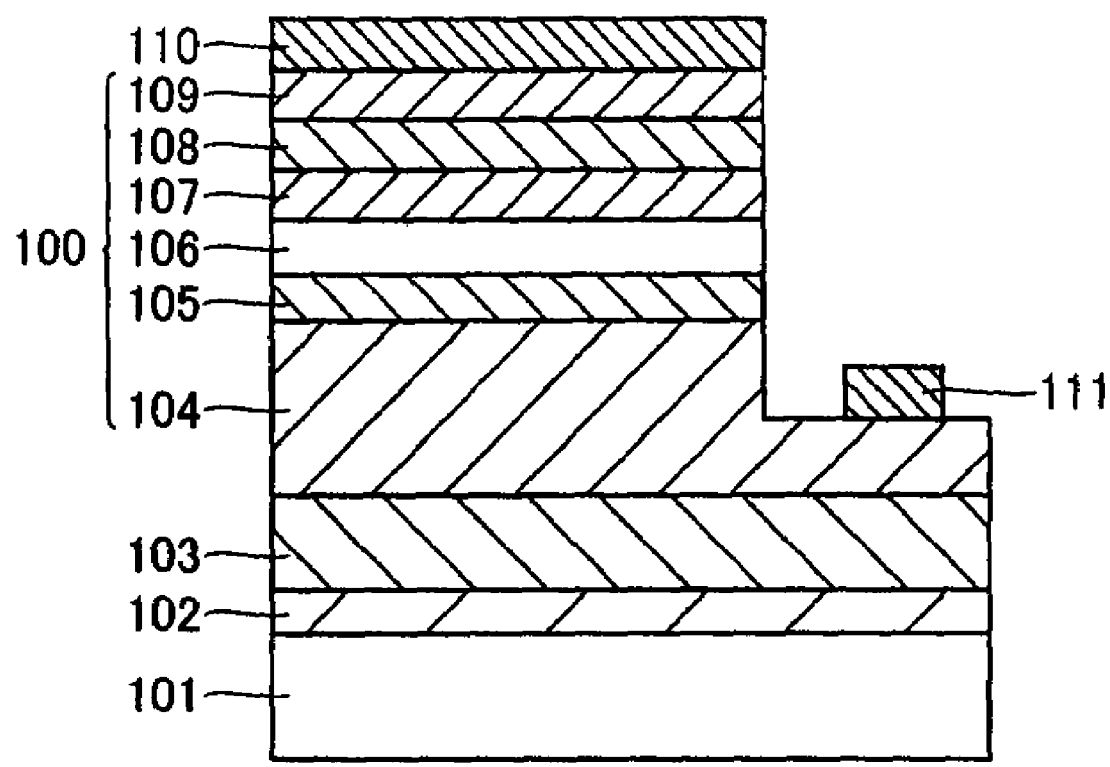
FIG. 35 is a sectional view showing the structure of a conventional nitride-based light-emitting diode device.

As shown in FIG. 34, the n-side electrode 9 having the composition and the thickness similar to those in the aforementioned first embodiment is formed on the prescribed region of the exposed surface of the n-type cladding layer 77 by vacuum evaporation or the like, and the device is thereafter separated from an adjacent device along the separation region 70a through a process similar to that of the first embodiment shown in FIG. 7. Thus, the nitride-based light-emitting diode device according to the fifth embodiment is formed as shown in FIG. 28.

Table 2 shows results of an experiment for investigating warping of a sample of the nitride-based light-emitting diode device according to the fifth embodiment prepared in practice according to the aforementioned manufacturing process and presence/absence of cracks on a nitride-based semiconductor element layer. Also as to samples of nitride-based light-emitting devices employing conductive substrates having linear expansion coefficients of about $12 \times 10^{-6}$/K, about $18 \times 10^{-6}$/K, about $20 \times 10^{-6}$/K and about $25 \times 10^{-6}$/K respectively, warping of the light-emitting diode devices and presence/absence of cracks formed on nitride-based semiconductor element layers were investigated in addition to the sample of the nitride-based light-emitting diode device according to the fifth embodiment having the linear expansion coefficient of about $9.5 \times 10^{-6}$/K. The linear expansion coefficients of about $12 \times 10^{-6}$/K, about $18 \times 10^{-6}$/K, about $20 \times 10^{-6}$/K and about $25 \times 10^{-6}$/K were adjusted by adjusting the mixing ratios of copper and copper oxide contained in the conductive substrates respectively. Referring to Table 2, "warping of device" is defined as the difference between the maximum and minimum thicknesses of the portion between the lower surface of the conductive substrate and the upper surface of the nitride-based semiconductor element layer in each sample.

TABLE 2

| Linear Expansion Coefficient ($\times 10^{-6}$/K) | Warping of Device (μm) | Crack |
|---|---|---|
| 9.5 (Fifth Embodiment) | 5 | no |
| 12 | 17 | no |
| 18 | 30 | no |
| 20 | 80 | yes |
| 25 | 130 | yes |

Referring to Table 2, it has been proved that the sample of the nitride-based light-emitting diode device according to the fifth embodiment employing the conductive substrate having the linear expansion coefficient of about $9.5 \times 10^{-6}$/K was extremely slightly warped by about 5 μm and the nitride-based semiconductor element layer thereof was not cracked. It has also been proved that the nitride-based light-emitting diode device having the linear expansion coefficient of about $12 \times 10^{-6}$/K was slightly warped by about 17 μm and the nitride-based semiconductor element layer thereof was not cracked. It has further been proved that the nitride-based light-emitting diode device having the linear expansion coefficient of about $18 \times 10^{-6}$/K was slightly warped by about 30 μm and the nitride-based semiconductor element layer thereof was not cracked. On the other hand, it has been proved that the nitride-based light-emitting diode devices having the linear expansion coefficients of about $20 \times 10^{-6}$/K and about $25 \times 10^{-6}$/K respectively were remarkably warped by about 80 μm and about 130 μm respectively and the nitride-based semiconductor element layers thereof were cracked. It is conceivable from these results that warping of the nitride-based light-emitting diode device can be reduced and the nitride-based semiconductor element layer can be inhibited from cracking when the linear expansion coefficient of the conductive substrate is not more than about $18 \times 10^{-6}$/K.

According to the fifth embodiment, as hereinabove described, the conductive substrate 71 is so formed as to contain copper and copper oxide mixed with each other at the ratio of 50:50 thereby setting the linear expansion coefficient of the conductive substrate 71 to about $9.5 \times 10^{-6}$/K, whereby the difference between the linear expansion coefficients of the conductive substrate 71 and the nitride-based semiconductor element layer 70 can be reduced. Thus, the nitride-based light-emitting diode device can be easily inhibited from warping or cracking resulting from large difference between the linear expansion coefficients of the conductive substrate 71 and the nitride-based semiconductor element layer 70 in the manufacturing process, whereby the manufacturing yield can be easily inhibited from reduction.

According to the fifth embodiment, further, the surface of the p-type contact layer 73 is so textured that the textured surface of the p-type contact layer 73 can easily reflect light similarly to that in the aforementioned fourth embodiment. Thus, the reflected light is emitted from the n side, whereby the light output characteristic can be improved. In addition, the surface of the conductive substrate 71 is textured similarly to the textured surfaces of the p-side electrode 72 formed on the p-type contact layer 73 while the conductive substrate 71 and the p-side electrode 72 are so bonded to each other that the positions of the recess portions (projecting portions) of the conductive substrate 71 coincide with the positions of the projecting portions (recess portions) of the p-side electrode 72, whereby the contact area between the conductive substrate 71 and the p-side electrode 72 is increased and heat radiation toward the conductive substrate 71 can be further improved.

Although the present invention has been described and illustrated in detail, it is clearly understood that the same is by way of illustration and example only and is not to be taken by way of limitation, the spirit and scope of the present invention being limited only by the terms of the appended claims.

For example, while the conductive substrate containing copper and copper oxide is employed in each of the aforementioned first to fifth embodiments, the present invention is not restricted to this but a conductive substrate containing a metal other than copper and a metal oxide other than copper oxide may alternatively be employed. For example, a conductive substrate containing aluminum and aluminum oxide may be employed. Further alternatively, a conductive substrate containing copper and aluminum oxide or aluminum and copper oxide may be employed. In place of copper or aluminum, gold, silver, molybdenum or tungsten may conceivably be employed as the metal constituting the conductive substrate.

While the sapphire, SiC, Si or GaN substrate is employed as the growth substrate in each of the aforementioned first to fifth embodiments, the present invention is not restricted to this but a GaAs, MgO, ZnO, LAO(LaAlO$_3$), Ga$_2$O$_3$, ZrB$_2$ or spinel substrate may alternatively be employed as the growth substrate.

While the p-side electrode consists of the lower Au layer (closer to the conductive substrate) having the thickness of about 100 nm and the upper Pd layer having the thickness of about 300 nm in each of the aforementioned first to fifth embodiments, the present invention is not restricted to this but the p-side electrode may alternatively consist of a plurality of metal layers other than the Au and Pd layers. For example, the p-side electrode may conceivably be constituted of an Al layer having a thickness of about 300 nm and a Pd layer having a thickness of about 10 nm, an Ag layer having a thickness of about 300 nm, a Ti layer having a thickness of about 10 nm and a Pt layer having a thickness of about 10 nm, an Ag layer having a thickness of about 300 nm and a Pd layer having a thickness of about 30 nm, an Al layer having a thickness of about 200 nm, an Ni layer having a thickness of about 50 nm, an Ag layer having a thickness of about 300 nm and a Ti layer having a thickness of about 1 nm, an Al layer having a thickness of about 200 nm, an Ni layer having a thickness of about 50 nm, an Ag layer having a thickness of about 300 nm and an Ni layer having a thickness of about 0.5 nm, an Al layer having a thickness of about 200 nm, an Ni layer having a thickness of about 50 nm, an Ag layer having a thickness of about 300 nm and an Al layer having a thickness of about 0.5 nm or a Ti layer having a thickness of about 20 nm, an Ag layer having a thickness of about 300 nm and an Al layer having a thickness of about 0.3 nm in ascending order, in place of the Au layer and the Pd layer. Further, the p-side electrode may be entirely or only partially formed on the surface of the nitride-based semiconductor element layer closer to the conductive substrate. When the p-side electrode is only partially formed on the surface of the nitride-based semiconductor element layer closer to the conductive substrate, a layer for reflecting light is preferably formed on a region other than that formed with the p-side electrode. Further, a pad electrode is preferably formed between the p-side electrode and the conductive substrate, in order to increase the bonding power therebetween. The pad electrode may conceivably be constituted of an Au layer, a Pd layer and a Ti layer, an Au layer, a Pt layer and a Ti layer or an Au layer, an Mo layer and a Ti layer in ascending order from the side closer to the conductive substrate, for example. When solder is employed for bonding the p-side electrode to the conductive substrate, a barrier metal layer of Pt or Pd is preferably formed as a protective film for the p-side electrode.

While the p-side electrode consists of the lower Au layer (closer to the conductive substrate) having the thickness of about 100 nm and the upper Pd layer having the thickness of about 300 nm in each of the aforementioned first to fifth embodiments, the present invention is not restricted to this but the thicknesses of and the materials for the metal layers constituting the p-side electrode may alternatively be changed to reduce the quantity of light absorption in the p-side electrode in response to the emission wavelength.

While the p-side electrode consists of the lower Au layer (closer to the conductive substrate) and the upper Pd layer in each of the aforementioned first to fifth embodiments, the present invention is not restricted to this but an Al layer having higher light reflectance than the Au or Pd layer may alternatively be employed for increasing the quantity of emitted reflected light, thereby further improving the light output characteristic. For example, the light output characteristic can be further improved by providing an electrode layer of a transparent material between the Al layer and the nitride-based semiconductor element layer.

While the n-side electrode consisting of the Au layer, the Pd layer and the Al layer and having the thickness incapable of transmitting light is employed in each of the aforementioned first to fifth embodiments, the present invention is not restricted to this but an electrode consisting of a metal, a transparent material and a translucent material or the like having a thickness capable of transmitting light can alternatively be employed. A pad electrode is preferably formed on the n-side electrode, in order to connect a gold wire thereto.

While the nitride-based semiconductor element layer includes the layer of GaN, AlGaN or InGaN in each of the aforementioned first to fifth embodiments, the present invention is not restricted to this but the nitride-based semiconductor element layer may alternatively include a layer other than the layer of GaN, AlGaN or InGaN. For example, a group III-V nitride semiconductor such as AlN (aluminum nitride), InN (indium nitride), BN (boron nitride) or TiN (thallium nitride) or a mixed crystal of the group III-V nitride semiconductor may conceivably be employed as a nitride-based semiconductor other than GaN, AlGaN or InGaN. Further, a mixed crystal prepared by introducing at least one element of As, P and Sb into the aforementioned group III-V nitride semiconductor or the mixed crystal is also conceivable.

While the surface of the n-type contact layer is not finely worked in each of the aforementioned first to fifth embodiments, the present invention is not restricted to this but the surface of the n-type contact layer may alternatively be textured by fine working. In this case, the quantity of light totally reflected on the surface of the n-type contact layer is reduced, whereby the light output characteristic can be improved. When an SiO$_2$ film or an SiN film having a textured surface is formed on a region of the surface of the n-type contact layer other than that formed with the n-side electrode, an effect of improving the light output characteristic can be attained.

While the conductive substrate and the nitride-based semiconductor element layer are bonded to each other through the electrode in each of the aforementioned first to fifth embodiments, the present invention is not restricted to this but the conductive substrate and the nitride-based semiconductor element layer may alternatively be bonded to each other through a conductive material other than the electrode. Further alternatively, the conductive substrate and the nitride-based semiconductor element layer may be boned to each other through both of the electrode and the conductive material.

While the isolation layer of $In_{0.5}Ga_{0.5}N$ is formed between the growth substrate and the nitride-based semiconductor element layer and the isolation layer is thereafter thermally decomposed by absorption of a laser beam thereby isolating the growth substrate and the nitride-based semiconductor element layer from each other in the aforementioned third embodiment, the present invention is not restricted to this but the isolation layer may alternatively be formed by a thin metal film or a thin insulating film absorbing a laser beam. The metal film absorbing a laser beam may be formed by a Ti film, an Al film, a Pd film, an Ni film or an Hf film. The insulating film absorbing a laser beam may be formed by a $TiO_2$ film, an $SiO_2$ film, a $ZrO_2$ film or an SiN film. Further alternatively, the isolation layer may be formed by stacking the aforementioned metal and insulating films with each other.

While the conductive substrate has the thermal conductivity of about 170 W/m·K in the aforementioned third embodiment, the present invention is not restricted to this but an effect similar to the above can be attained so far as the thermal conductivity of the conductive substrate is at least about 100 W/m·K.

While the conductive substrate has the Young's modulus of about 50 GPa in the aforementioned fourth embodiment, the present invention is not restricted to this but an effect similar to the above can be attained so far as the Young's modulus of the conductive substrate is not more than about 120 GPa.

While the conductive substrate has the linear expansion coefficient of about $9.5 \times 10^{-6}$/K in the aforementioned fifth embodiment, the present invention is not restricted to this but an effect similar to the above can be attained so far as the linear expansion coefficient of the conductive substrate is not more than about $18 \times 10^{-6}$/K.

What is claimed is:

1. A method of manufacturing a nitride-based light-emitting device, comprising steps of:
    growing a nitride-based semiconductor element layer on a growth substrate;
    forming an electrode on a surface of said nitride-based semiconductor element layer;
    bonding a conductive substrate at least containing a single type of metal and a single type of inorganic material having a lower linear expansion coefficient than said metal on a surface of said electrode; and
    removing said growth substrate from said nitride-based semiconductor element layer to which said conductive substrate is bonded through said electrode, wherein
    said step of forming said electrode on said surface of said nitride-based semiconductor element layer includes steps of:
    forming a protective film on a side surface of said nitride-based semiconductor element layer,
    texturing said surface of said nitride-based semiconductor element layer after forming said protective film, and
    forming said electrode on said textured surface of said nitride-based semiconductor element layer.

2. The method of manufacturing a nitride-based light-emitting device according to claim 1, wherein
    said inorganic material includes a metal oxide.

3. The method of manufacturing a nitride-based light-emitting device according to claim 1, wherein
    said step of forming said electrode on said textured surface of said nitride-based semiconductor element layer includes a step of forming said electrode on said textured surface of said nitride-based semiconductor element layer to have a textured surface reflecting said texture on said surface of said nitride-based semiconductor element, and
    said step of bonding said conductive substrate to said surface of said electrode opposite to said nitride-based semiconductor element layer includes steps of:
    texturing a surface of said conductive substrate, and
    bonding said conductive substrate to said surface of said electrode opposite to said nitride-based semiconductor element layer so that the positions of projecting and recess portions of said electrode and the positions of recess and projecting portions of said conductive substrate coincide with each other.

4. The method of manufacturing a nitride-based light-emitting device according to claim 1, wherein
    said step of forming said electrode on said surface of said nitride-based semiconductor element layer includes steps of:
    forming said protective film on said surface and said side surface of said nitride-based semiconductor element layer,
    removing said protective film on said surface of said nitride-based semiconductor element layer after forming said protective film, and
    texturing a region of said surface of said nitride-based semiconductor element layer where said protective film is removed.

* * * * *